(12) United States Patent
Kawamura et al.

(10) Patent No.: US 8,647,440 B2
(45) Date of Patent: Feb. 11, 2014

(54) SUBSTRATE PROCESSING METHOD AND SUBSTRATE PROCESSING APPARATUS

(75) Inventors: Shigeru Kawamura, Nirasaki (JP); Teruyuki Hayashi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 752 days.

(21) Appl. No.: 12/443,484

(22) PCT Filed: Oct. 1, 2007

(86) PCT No.: PCT/JP2007/069206
§ 371 (c)(1),
(2), (4) Date: Mar. 30, 2009

(87) PCT Pub. No.: WO2008/038823
PCT Pub. Date: Apr. 3, 2008

(65) Prior Publication Data
US 2010/0043820 A1 Feb. 25, 2010

(30) Foreign Application Priority Data
Sep. 29, 2006 (JP) ................. 2006-269304

(51) Int. Cl.
*B08B 6/00* (2006.01)
*B08B 3/00* (2006.01)
*B08B 5/00* (2006.01)

(52) U.S. Cl.
USPC .................. 134/1.3; 134/26; 134/30; 134/31

(58) Field of Classification Search
USPC .................. 134/19, 1.3, 1, 26, 30, 31, 39, 42
See application file for complete search history.

(56) References Cited

U.S. PATENT DOCUMENTS

| 6,465,374 | B1* | 10/2002 | Butterbaugh et al. | 438/795 |
| 6,831,018 | B2* | 12/2004 | Kanegae | 438/706 |
| 2004/0203251 | A1 | 10/2004 | Kawaguchi et al. | |
| 2005/0245099 | A1 | 11/2005 | Endo et al. | |

(Continued)

FOREIGN PATENT DOCUMENTS

| JP | 4 83340 | 3/1992 |
| JP | 4-83340 | 3/1992 |

(Continued)

OTHER PUBLICATIONS

Combined Office Action and Search Report issued May 9, 2013 in Taiwanese Application No. 096136351 (With English Translation of Category of Cited Documents).

*Primary Examiner* — Eric Golightly
*Assistant Examiner* — Arlyn I Rivera-Cordero
(74) *Attorney, Agent, or Firm* — Oblon, Spivak, McClelland, Maier & Neustadt, L.L.P.

(57) ABSTRACT

Disclosed is a substrate treatment method intended for a substrate having, on its surface, a composite product of an inorganic material containing silicon oxide and an organic material containing carbon and fluorine. The method comprises: an ultraviolet ray treatment step for irradiating the surface of the substrate with ultraviolet ray to remove a part of the organic material; a hydrogen fluoride processing step which is conducted after the ultraviolet ray processing step and which is for supplying a steam of hydrogen fluoride onto the surface of the substrate to remove at least a part of the inorganic material; and a heating processing step which is conducted after the ultraviolet ray processing step and which is for heating the substrate to cause the shrinkage of a part of the organic material that remains unremoved.

5 Claims, 25 Drawing Sheets

(56) References Cited

U.S. PATENT DOCUMENTS

2006/0093969 A1* 5/2006 Kido .............................. 430/330
2006/0144421 A1* 7/2006 Matsuo et al. .................... 134/2
2008/0056857 A1* 3/2008 Hiroki ........................ 414/217.1

FOREIGN PATENT DOCUMENTS

| JP | 2005-52967 | 3/2005 |
| JP | 2005 52967 | 3/2005 |
| JP | 2005 333110 | 12/2005 |

* cited by examiner

GENERATION OF DEPOSITS BY CF-BASED GAS

SUBSTRATE PROCESSING METHOD AND SUBSTRATE PROCESSING APPARATUS

FIELD OF THE INVENTION

The present invention relates to a technology for effectively removing a mixture or laminate of an inorganic material containing silicon oxide and a fluorine-based organic material formed on a substrate when, e.g., plasma processing is performed on the substrate.

BACKGROUND OF THE INVENTION

Semiconductor device manufacturing processes include an etching process for etching a substrate by using a plasma. In this etching process, etching gas reacts with a layer to be etched or a base layer to produce a composite product on the substrate, and the composite product can remain thereon.

For example, a contact hole for connecting an electrode to a source or drain region of a MOS transistor is formed in a silicon oxide layer on a silicon substrate by etching in which a CF-based etching gas and oxygen gas is used.

FIG. 16 schematically shows a composite product 208a produced on the bottom of a contact hole 208. In FIG. 16, the components of the composite product 208a are also shown in a combined form. When a silicon oxide film 202 formed on a silicon layer 201 of a substrate 200 is etched by using a CF-based etching gas and an oxygen gas, an amorphous silicon layer 203 and the composite product 208a formed of a CF polymer 205 (containing carbon and fluorine) and a silicon oxide layer 204 are formed sequentially on the bottom of the contact hole 208. This is considered to be formed by the following process.

When the silicon oxide film 202 is etched to expose the surface of the silicon layer 201, as shown in FIG. 17B, the surface layer of the silicon layer 201 is changed by a plasma energy into an amorphous silicon layer 203. Further, the top portion of the amorphous silicon layer 203 is oxidized by a plasma of an oxygen gas to form the silicon oxide layer 204 (FIG. 17C). Thereafter, the CF polymer 205 containing carbon and fluorine is accumulated on the silicon oxide layer 204 to form the composite product (208a) (FIG. 17D). The composite product 208a increases contact resistance, thus reducing the yield of semiconductor devices. For this reason, the composite product 208a needs to be removed.

Conventionally, there is known a technique in which ashing is carried out by using an oxygen plasma to remove CF residues after completing etching process. However, the oxygen plasma cannot be used, because the use of the oxygen plasma increases an oxidation of the silicon layer 201 on the substrate 200.

Further, from results of various experiments, it has been found that the composite product 208a is not a simple laminate schematically shown in FIG. 17D. That is, the silicon oxide layer 204 may be a mixture of a silicon oxide 207 and a CF compound 206 as shown in FIG. 18A or a compound in which silicon, oxygen, carbon and fluorine are chemically bonded to each other as shown in FIG. 18B, which is in a very stable state. For this reason, the composite product 208a has not been able to be sufficiently removed by a process of cleaning the substrate with an organic solvent or an acidic solution, which is generally carried out after etching. Particularly, as the design rule of semiconductor devices continues to be further miniatured or the aspect ratio increases, the cleaning solution cannot be (sufficiently diffused into holes or trenches, and thus sufficient cleaning cannot be achieved.

The composite product 208a is a composite of organic and inorganic materials. Thus, if a process for removing the inorganic material is carried out, the organic material cannot be removed, or if a process for removing the organic material is carried out, the inorganic material cannot be removed. That is, the composite product 208a is considered a very troublesome residue. For this reason, developing a method of removing such residue from the semiconductor device has become a very pressing task.

Further, it has been suggested that, in a process for manufacturing a specific kind of device, as shown in FIG. 19A, etching is performed on a substrate in which a silicon oxide film 210 and a polysilicon film 211 are alternately laminated (for example, in two layers), through a resist film 215, thereby forming a recess 220.

In this case, a plasma of a halogen gas and a plasma of a gas containing carbon and fluorine are used to etch the polysilicon film 211 and the silicon oxide film 210, respectively. In the etching of the polysilicon film 211, a halogenated silicon oxide 213 containing halogen, silicon and oxygen is deposited on the sidewall of the recess 220. Meanwhile, in the etching of the silicon oxide film 210, a polymer 212 containing carbon and fluorine is deposited on the sidewall of the recess 220. As a result, as shown in FIG. 19B, a laminated product 214 laminated with the halogenated silicon oxide 213 and the polymer 212 is deposited on the sidewall of the recess 220.

The laminated product 214 also reduces the yield of semiconductor devices, and thus needs to be removed. However, the laminated product is difficult to remove reliably, because it is a stable material.

Japanese Patent Laid-open Application No. H4-83340 (particularly, page 2, light column, lines 23-44, and page 7, left column, pages 10-15) discloses a method of removing particles produced during etching of a substrate by using HF steam after cleaning the substrate with alcohol steam. However, the above-described inorganic/organic composite product is not mentioned therein.

SUMMARY OF THE INVENTION

In view of the above, the present invention provides a substrate processing method and apparatus which can reliably remove a composite product of inorganic and organic materials, formed on a substrate by plasma processing. Further, the present invention can be applied to a method for cleaning either a processing chamber in which the above-described composite product has been generated or components in the processing chamber.

In accordance with a first aspect of the present invention, there is provided a substrate processing method performed on a substrate having a composite product formed on the surface thereof, the composite product being formed of an inorganic material containing silicon oxide and an organic material containing carbon and fluorine.

The method includes: ultraviolet ray processing of irradiating ultraviolet rays on the surface of the substrate to remove a part of the organic material; hydrogen fluoride processing which is performed after the ultraviolet ray processing to supply hydrogen fluoride steam onto the surface of the substrate to remove at least a part of the inorganic material; and heat processing which is performed after the ultraviolet ray processing and in which the substrate is heated to shrink a part of the organic material that still remains.

In accordance with the present invention, the composite product formed of inorganic and organic materials formed on the surface of the substrate can be very effectively removed by a combination of the ultraviolet ray processing, the hydrogen fluoride processing and the heat processing.

The hydrogen fluoride processing may be performed at least once before and at least once after the heat processing.

The substrate in the heat processing is preferably heated to 100° C. or higher.

In accordance with a second aspect there is provided a substrate processing method performed on a substrate having a composite product formed on the surface thereof, the composite product being formed of an inorganic material containing silicon oxide and an organic material containing carbon and fluorine.

The method includes: ultraviolet ray processing of irradiating ultraviolet rays on the surface of the substrate to remove a part of the organic material; hydrogen fluoride processing which is performed after the ultraviolet ray processing to supply hydrogen fluoride steam onto the surface of the substrate to remove at least a part of the inorganic material, wherein a processing group formed of the ultraviolet ray processing and the hydrogen fluoride processing is repeated two or more times.

In accordance with the present invention, the composite product of inorganic and organic materials formed on the substrate can be very effectively removed by repeating the group formed of the ultraviolet ray processing and the hydrogen fluoride processing two or more times.

The above-described method further includes a heat processing of heating the substrate to shrink a portion of the organic material that still remains. In this case, the substrate in the heat processing is preferably heated to 100° C. or higher.

In accordance with a third aspect of the present invention, there is provided a substrate processing method including: composite product forming processing of subjecting a substrate to processing in which a composite product formed of an inorganic material containing silicon oxide and an organic material containing carbon and fluorine is formed on a surface of the substrate; ultraviolet ray processing which is performed after the composite product forming processing to irradiate ultraviolet rays (onto the surface of the substrate to remove a part of the organic material; and hydrogen fluoride processing which is performed after the ultraviolet ray processing to supply hydrogen fluoride steam onto the surface of the substrate to remove at least a part of the inorganic material.

The composite product forming processing, the ultraviolet ray processing and the hydrogen fluoride processing are performed in a vacuum atmosphere.

In accordance with the present invention, the composite product of inorganic and organic materials can be very effectively removed by the ultraviolet ray processing and hydrogen fluoride processing, which are performed in a vacuum atmosphere.

Preferably, the composite product forming processing, the ultraviolet ray processing and the hydrogen fluoride processing are continuously performed in the same vacuum atmosphere.

In the composite product forming processing, a silicon oxide film formed on a silicon layer on the substrate may be etched in a predetermined pattern up to a surface portion of the silicon layer by a plasma generated from a processing gas including a gas containing carbon and fluorine and an oxygen gas, thereby forming a recess.

In the composite product forming processing, a laminate formed of a silicon oxide film and a polysilicon film, which are laminated on the substrate in that order, may be etched in a predetermined pattern, thereby forming a recess.

The processing includes: etching the polysilicon film by a plasma generated from a processing gas containing halogen; and etching the silicon oxide film by a plasma generated from a processing gas containing carbon and fluorine.

In accordance with a fourth aspect of the present invention, there is provided a cleaning method of cleaning an internal surface of a processing chamber and/or surfaces of the internal components of the processing chamber, after subjecting a substrate to processing in which a composite product formed of an inorganic material containing silicon and an organic material containing carbon and fluorine is formed on a surface of the substrate in the processing chamber.

The method includes: ultraviolet ray processing of irradiating ultraviolet rays onto the internal surface of the processing chamber and/or the surfaces of the internal components of the processing chamber to remove a part of an organic material formed in the processing chamber and/or on the internal components of the processing chamber; hydrogen fluoride processing which is performed after the ultraviolet ray processing to supply hydrogen fluoride steam onto the internal surface of the processing chamber and/or the surfaces of the internal components of the processing chamber to remove at least a part of an inorganic material formed in the processing chamber and/or on the internal components of the processing chamber; and heat processing which is performed after the ultraviolet ray processing to heat the internal surface of the processing chamber and/or the surfaces of the internal components of the processing chamber to remove a part of the organic material that still remains.

In accordance with the present invention, the composite product formed of inorganic and organic materials formed on the internal surface of the processing chamber and/or on the surfaces of the internal components of the processing chamber can be very effectively cleaned and removed by a combination of the ultraviolet ray processing, the hydrogen fluoride processing and the heat processing.

The hydrogen fluoride processing may be performed at least once before and at least once after the heat processing.

The substrate in the heat processing may be heated to 100° C. or higher.

In accordance with a fifth aspect of the present invention, there is provided a method of cleaning an internal surface of a processing chamber and/or surfaces of the internal components of the processing chamber, after subjecting a substrate to processing in which a composite product formed of an inorganic material containing silicon and an organic material containing carbon and fluorine is formed on a surface of the substrate in the processing chamber.

The method includes: ultraviolet ray processing of irradiating ultraviolet rays onto the internal surface of the processing chamber and/or the surfaces of the internal components of the processing chamber to remove a part of an organic material formed in the processing chamber and/or on the internal components of the processing chamber; and hydrogen fluoride processing which is performed after the ultraviolet ray processing to supply hydrogen fluoride steam onto the internal surface of the processing chamber and/or the surfaces of the internal components of the processing chamber to remove at least a part of an inorganic material formed in the processing chamber and/or on the internal components of the processing chamber.

A group formed of the ultraviolet ray processing and the hydrogen fluoride processing is repeated two or more times.

In accordance with the present invention, the composite product formed of inorganic and organic materials formed on the internal surface of the processing chamber and/or on the surfaces of the internal components of the processing chamber can be very effectively cleaned and removed by repeating the group formed of the ultraviolet ray processing and the hydrogen fluoride processing two or more times.

The above-described method further includes a heat processing of heating the internal surface of the processing chamber and/or the surface of the internal components of the processing chamber to shrink a part of the organic material that still remains. In this case, the internal surface of the processing chamber and/or the surfaces of the internal components of the processing chamber are/is heated to 100° C. or above.

In accordance with a sixth aspect of the present invention, there is provided a substrate processing apparatus adopted to perform processing on a substrate having on the surface thereof a composite product formed of an inorganic material containing silicon oxide and an organic material containing carbon and fluorine.

The apparatus includes: an ultraviolet ray processing module in which ultraviolet rays are irradiated onto the surface of the substrate to remove a part of the organic material; a hydrogen fluoride processing module in which hydrogen fluoride steam is supplied onto the surface of the substrate to remove at least a part of the inorganic material; a heat treatment module in which the substrate is heated to shrink a part of the organic material that still remains; and a control unit which is connected to the ultraviolet ray processing module, the hydrogen fluoride processing module and the heat processing module to control these modules.

The control unit controls each of the modules so that, after processing by the ultraviolet ray processing module is performed, processing by the hydrogen fluoride processing module and processing by the heat processing module are performed in a proper order.

In accordance with the present invention, the composite product of inorganic and organic materials formed on the surface of the substrate can be very effectively removed by a combination of the ultraviolet ray processing module, the hydrogen fluoride processing module and the heat processing module.

The control unit may control each of the modules, so that processing by the hydrogen fluoride processing module is performed at least once before and also at least once after processing by the heat processing module.

Further, the heat processing module may heat the substrate to 100° C.

The heat processing module may be provided together with the UV ray processing module by installing heating means in the UV ray processing module.

IN accordance with a seventh aspect of the present invention, there is provided a substrate processing apparatus adopted to perform processing on a substrate having on the surface thereof a composite product formed of an inorganic material containing silicon oxide and an organic material containing carbon and fluorine.

The apparatus includes: an ultraviolet ray processing module in which ultraviolet rays are irradiated onto the surface of the substrate to remove a part of the organic material; a hydrogen fluoride processing module in which hydrogen fluoride steam is supplied onto the surface of the substrate to remove at least a part of the inorganic material; and a control unit which is connected to the ultraviolet ray processing module and the hydrogen fluoride processing module to control these modules.

The control unit controls each of the modules so that a group formed of processing by the ultraviolet ray processing module and processing by the hydrogen fluoride processing module is repeatedly performed two or more times.

In accordance with the present invention, the composite product formed of inorganic and organic materials formed on the surface of the substrate can be very effectively removed by repeating the group formed of processing by the ultraviolet ray processing module and processing by the hydrogen fluoride processing module two or more times.

The apparatus further preferably includes a heat processing module in which the substrate is heated to shrink a part of the organic material that still remains, wherein the control unit is also connected to the heat processing module to control it. The heat processing module may heat the substrate to 100° C. or higher.

The heat processing module is preferably provided together with the ultraviolet ray processing module by installing heating means in the UV ray processing module.

The apparatus may further include: a processing module which subjects the substrate to processing in which the composite product formed of the inorganic material containing silicon oxide and the organic material containing carbon and fluorine is formed.

The apparatus preferably further includes a substrate transfer module having a chamber into which the substrate is loaded and substrate transfer means provided therein. An atmosphere inside of the chamber of the substrate transfer module may be a vacuum atmosphere. In this case, preferably, the substrate transfer module, the ultraviolet ray processing module and the hydrogen fluoride processing module are airtightly connected to communicate with each other.

In accordance with an eighth aspect of the present invention, there is provided a storage medium adopted to store a computer-readable program which is used in a substrate processing apparatus and operated on a computer, wherein the program is configured to execute the substrate processing method described above.

In accordance with a ninth aspect of the present invention, there is provided a storage medium adopted to store a computer-readable program which is used in a substrate processing apparatus and operated on a computer, wherein the program is configured to execute the cleaning method described above.

DETAILED DESCRIPTION OF THE EMBODIMENTS

First Embodiment

As an embodiment of a substrate processing method in accordance with the present invention, a first embodiment which is a process of removing a composite product after forming a contact hole by etching will now be described.

Figure 1:
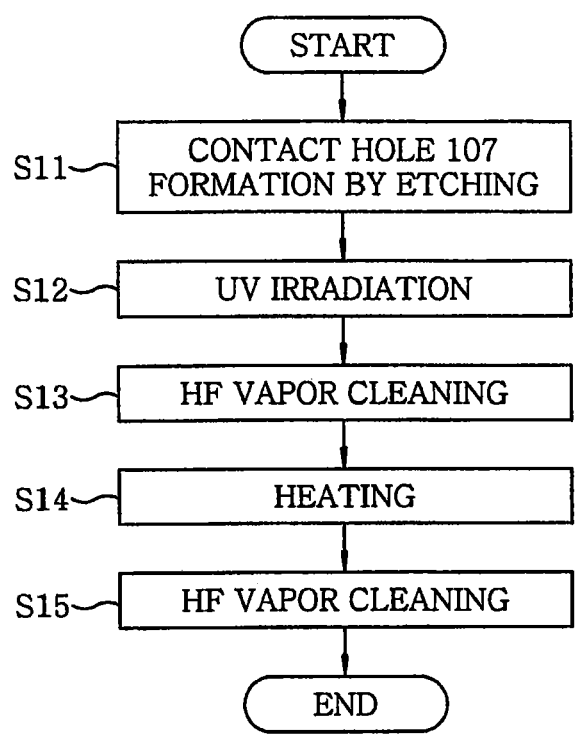
FIG. 1 shows a process flowchart of a first embodiment of the present invention.
Figure 2A:
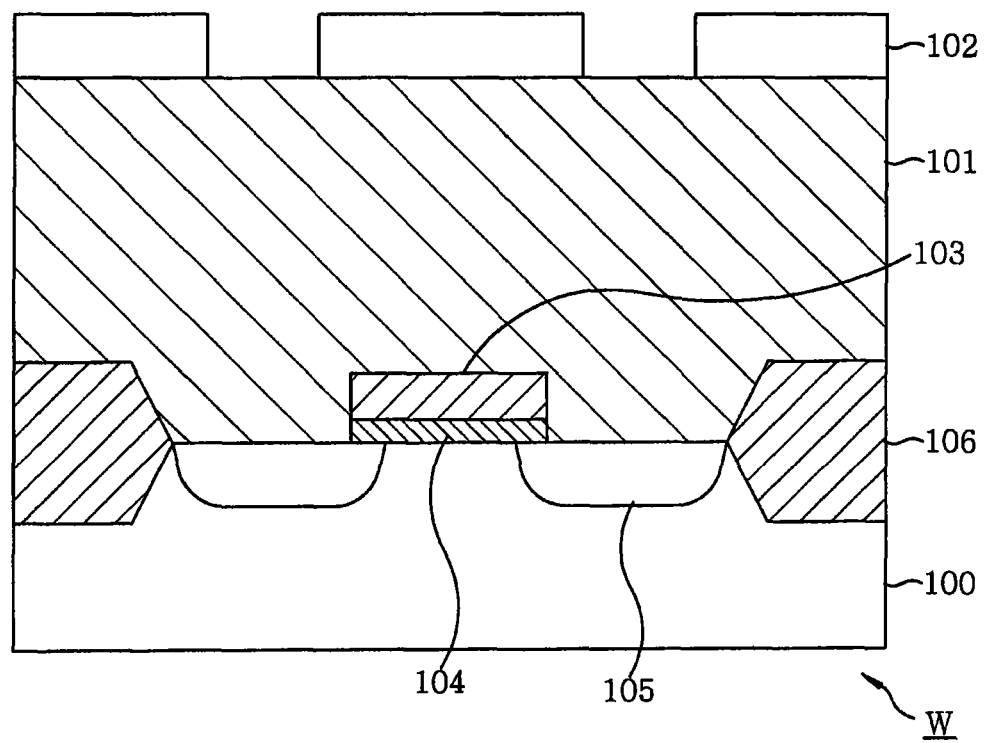
FIG. 2A is a cross-sectional view of a substrate before etching in the first embodiment.
Figure 2B:
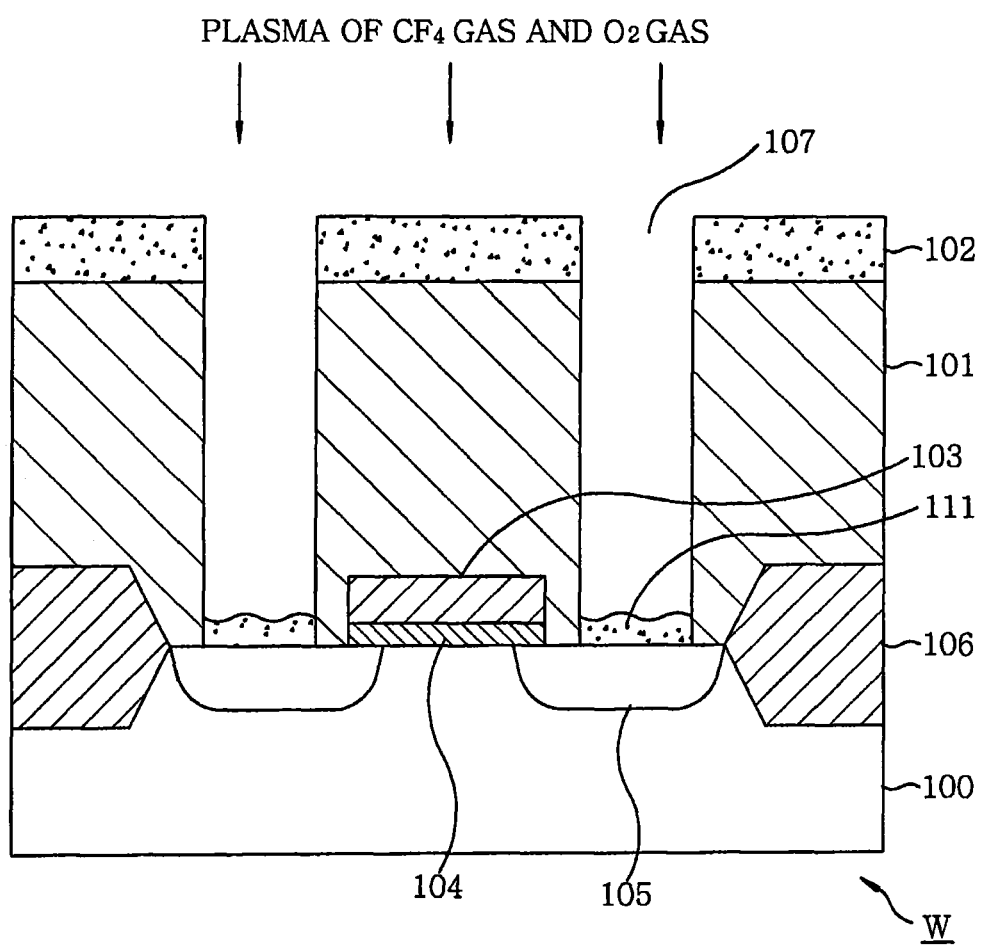
FIG. 2B is a cross-sectional view of a substrate after etching in the first embodiment.

FIG. 1 is a flowchart showing a procedure starting from a formation of a composite product to a removal thereof in the first embodiment. In Step S11, etching is performed on a wafer W having a structure shown in FIG. 2A on the surface thereof. In FIGS. 2A and 2B, reference numeral 100 is a silicon substrate, 101 is, for example, a silicon oxide film which is an insulating film, and 102 is a resist mask. Further, reference numeral 103 is a gate electrode, 104 is a gate oxide film, 105 is an impurity diffusion layer, and 106 is an isolation layer.

(Step S11: Step of Etching Silicon Oxide Film 101)

For example, in a plasma processing apparatus 51 which will be described later, a processing gas including, for example, $CF_4$ gas and $O_2$ gas, is converted into a plasma, and the silicon oxide film 101 is etched by the plasma. Thus, as shown in FIG. 2B, contact holes 107 that are recesses are formed. By such etching, a composite product 111 is formed on the bottom of the contact hole 107 (the surface portion of the silicon substrate 100) as described above. At this time, the surface layer of the silicon substrate 100 which is exposed to the bottom surface of the contact hole 107 is changed into an amorphous silicon layer 108 by an energy of the plasma as described above. Further, the surface layer of the amorphous silicon layer 108 is oxidized by the plasma of oxygen gas to form a silicon oxide layer 109.

Figure 18A:
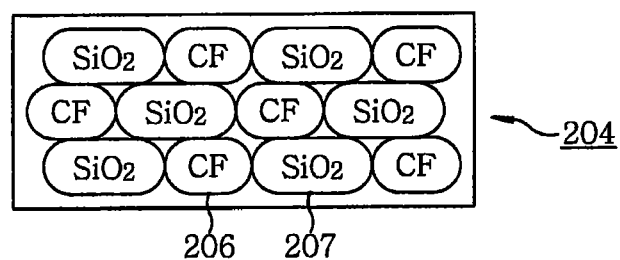
FIGS. 18A and 18B are conceptual views showing examples of the composition of the composite product shown in FIG. 16.
Figure 18B:
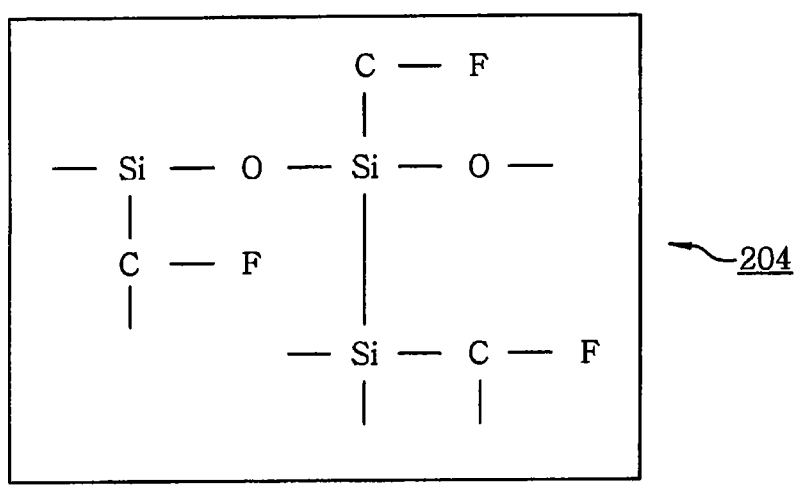
Figure 19A:
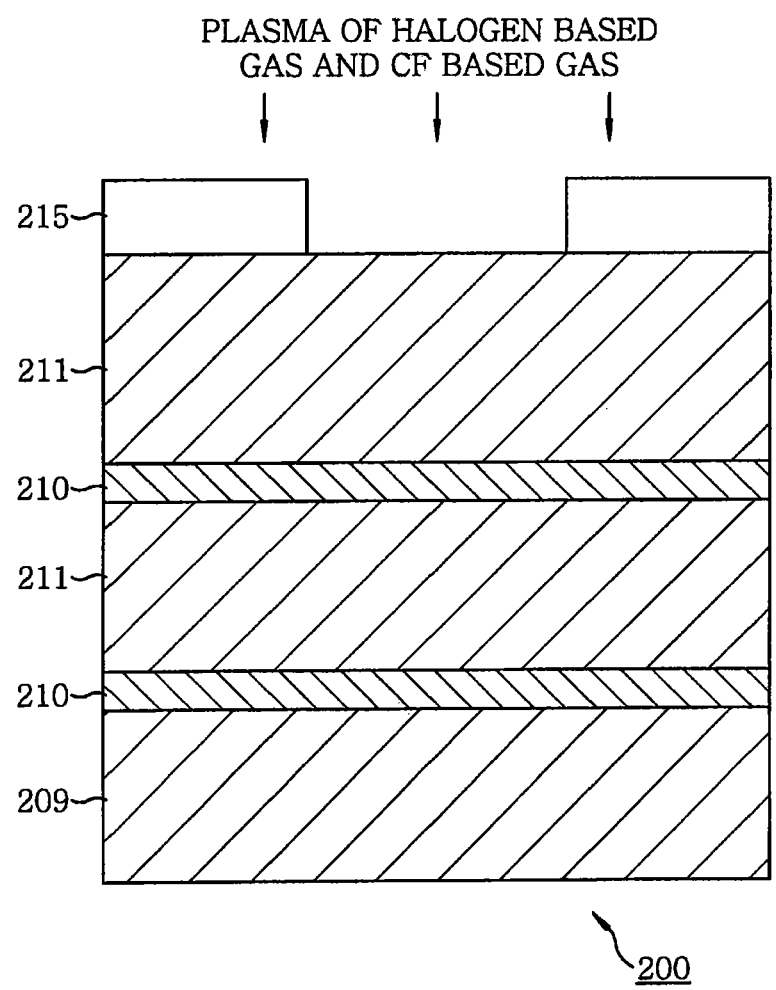
FIGS. 19A and 19B are views showing a laminate product formed by etching.
Figure 19B:
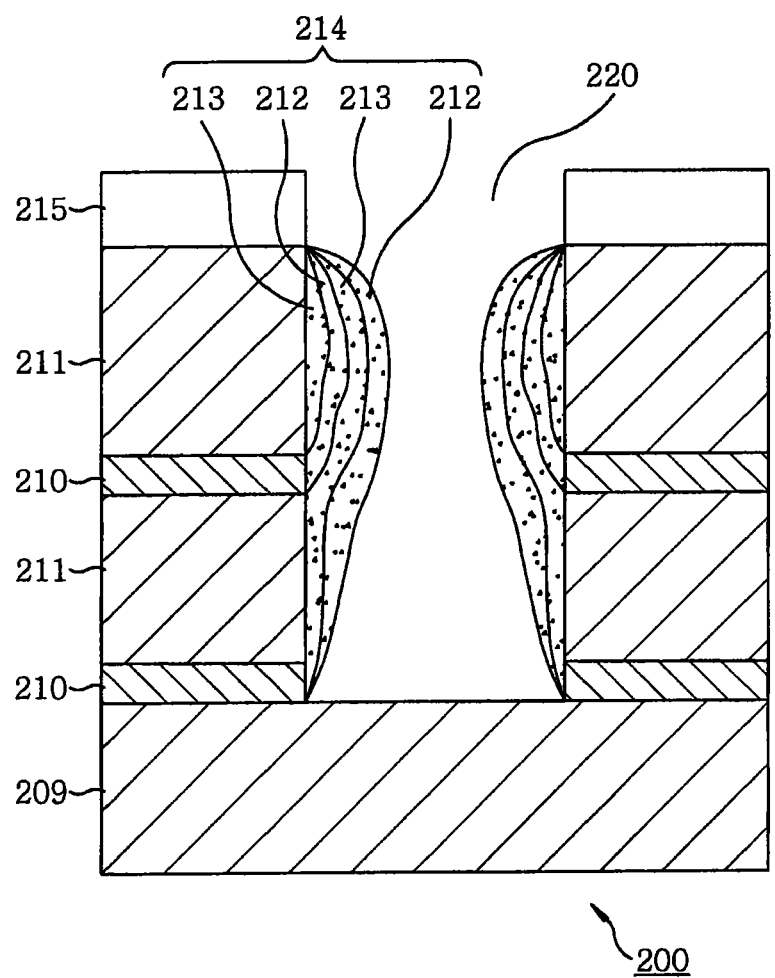

In order to intuitively perceive the correspondence between respective processing steps and the states of the composite product 111, the shapes of the bottom of one of the contact holes 107 are schematically shown in FIGS. 3A to 3E. As shown therein, on the surface of the silicon oxide layer 109, a polymer 110 containing carbon and fluorine is formed. Actually, the polymer 110 penetrates into the silicon oxide layer 109 in a form of particles or molecules and mixed with the silicon oxide 112 in a complicated form as shown in FIG. 18A. The polymer 110 and the silicon oxide layer 109 form the composite product 111.

In a macroscopic view, the polymer 110 is shown to be deposited on the silicon oxide layer 109. However, the silicon oxide layer 109 is formed with a silicon oxide 112 and a polymer 110a, and thus the reference numerals 110 and 110a will be used with distinction therebetween in the description of the schematic views.

(Step S12: UV Irradiation Step)

Then, a wafer W is irradiated with UV lights of a wavelength of, for example, 172 nm, for a predetermined time, while the wafer W is heated to be kept at 200° C. by heating means (not shown) such as a halogen lamp.

Figure 4A:
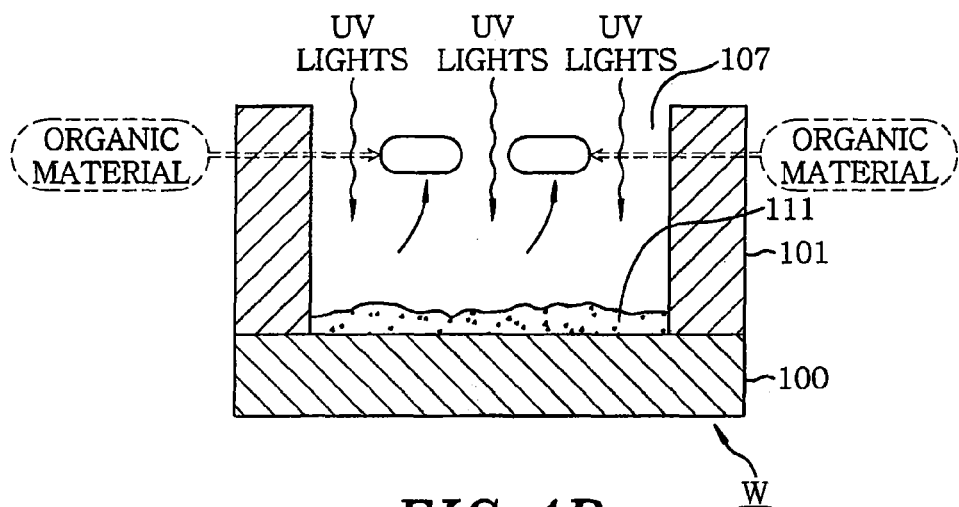
FIG. 4A to 4C schematically show cross-sectional views of a substrate when respective steps of the first embodiment are performed.

The UV irradiation breaks, for example, carbon-fluorine bonds or carbon-carbon bonds in the polymer 110, so that the polymer 110 is gasified and removed as shown in FIG. 4A. Due to the removal of the polymer 110, the UV lights also irradiate the exposed surface of the silicon oxide layer 109, whereby the polymer 110a on the surface of the silicon oxide layer 109 is removed. Further, by heating the wafer W, removal of the polymer 110 and the polymer 110a in this step is facilitated.

Figure 3A:
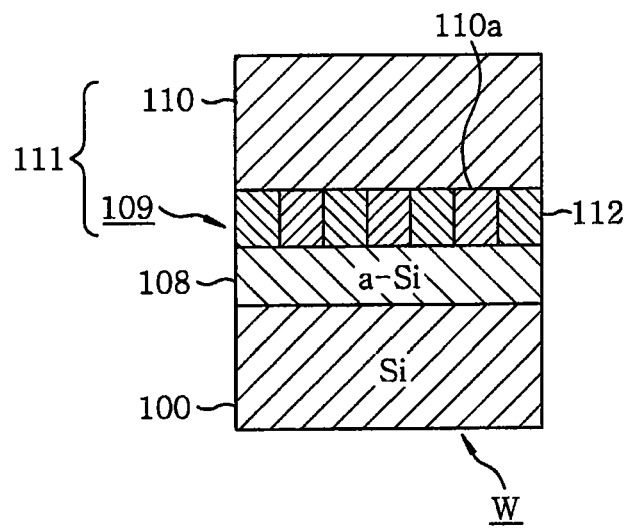
FIGS. 3A to 3E schematically show cross-sectional views of the bottom of a contact hole in a substrate when respective steps of the first embodiment are performed.
Figure 3B:
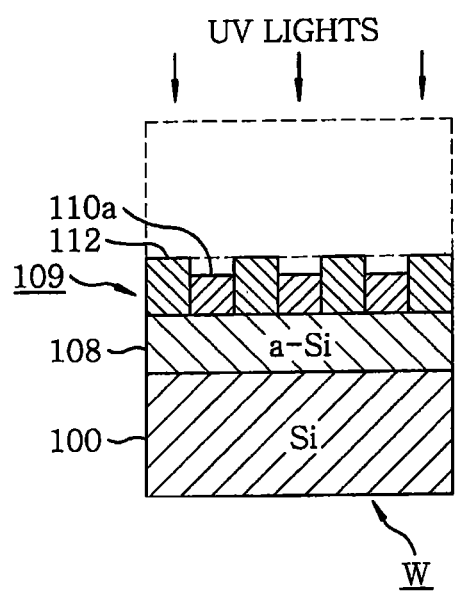

As a result, the silicon oxide 112 in the silicon oxide layer 109 is exposed, whereby, as shown in FIG. 3B, the ratio of the silicon oxide 112 in the surface of the silicon oxide layer 109 increases. Further, as shown in FIG. 3A, the polymer 110 formed on the silicon oxide layer 109 is thicker than the polymer 110a in the silicon oxide layer 109. However, the polymer 110 is quickly removed during the heating of the wafer W together with UV light irradiation.

(Step S13: Step of Cleaning with HF Steam)

Figure 3C:
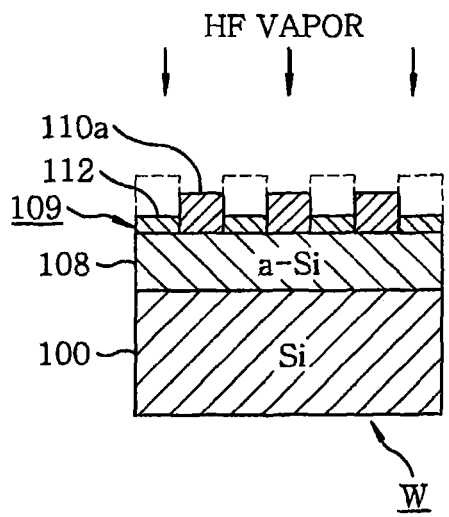
Figure 4B:
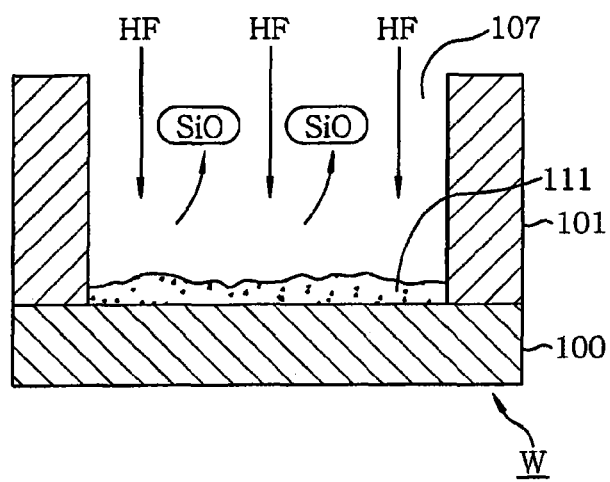

Then, hydrogen fluoride (HF) steam is supplied onto the wafer W for, for example, 600 seconds. When the wafer W is exposed to the HF steam, as shown in FIG. 4B, the silicon oxide 112 on the surface of the wafer W is dissolved by the HF steam and removed together with the HF steam from the wafer W. As a result, the polymer 110a in the silicon oxide layer 109 is exposed, whereby, the ratio of the polymer 110a in the surface of the silicon oxide layer 109 increases as shown in FIG. 3C.

Further, by the HF steam, the surface of the silicon oxide film 101 (the top surface and sidewall of the contact hole 107) is also etched, but the etched amount is very small. Thus, the description of this etching will be omitted herein.

(Step S14: Heating Step)

Then, the wafer W is heated to, for example, 300° C.

Figure 4C:
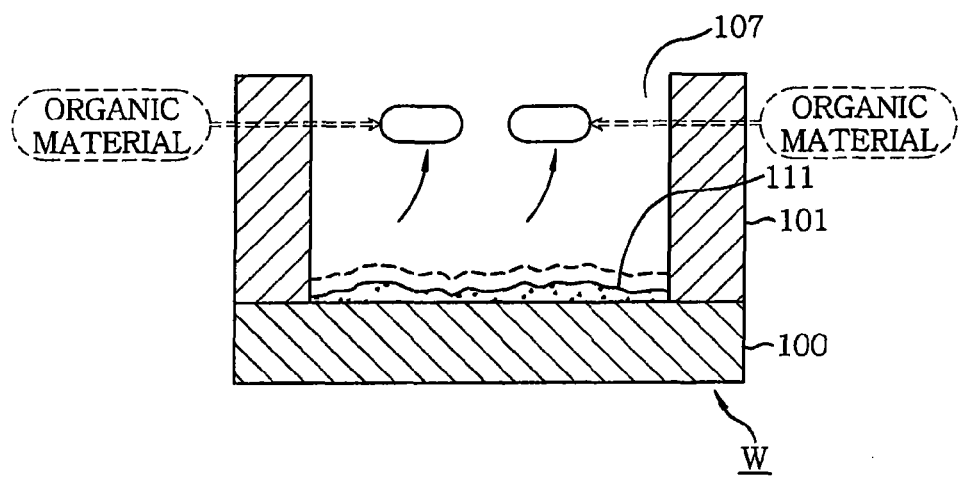

By such heating, as shown in FIG. 4C, a portion having weak bonding strength of the polymer 110a either dispersed in the silicon oxide layer 109 or bonded with the silicon oxide 112 in the silicon oxide layer 109 is released from its bonding to be separated and gasified. The gas passes through a gap between, for example, the polymer 110a and the silicon oxide 112, is diffused to the surface of the wafer W and removed from the wafer W.

Figure 3D:
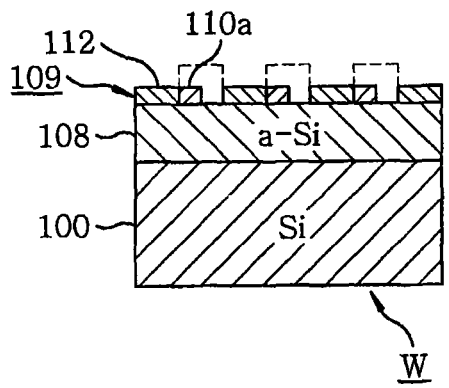

As a result, only a portion having strong bonding strength in the polymer 110a remains mainly in the silicon oxide layer 109, and thus, as shown in FIG. 3D, the volume of the polymer 110a is shrunk. By the shrinkage of the polymer 110a, the gap between the polymer 110a and the silicon oxide 112 widens, so that the above-described gas can easily escape out of the surface of the wafer W. For this reason, the shrinkage of the polymer 110*a* rapidly progresses and is also accelerated.

(Step S15: Step of Cleaning with HF Steam)

Figure 3E:
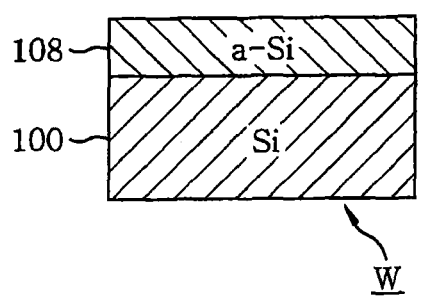

Then, HF steam is supplied again onto the wafer W for, for example, 600 seconds. Since the gap between the polymer 110*a* and the silicon oxide 112 widens as the result of the heating step of Step S14, the HF steam can diffuse to the inside of the silicon oxide layer 109 via the gap. Accordingly, the silicon oxide 112 in the silicon oxide layer 109 is almost removed. At this time, even though a small amount of the polymer 110*a* remains in the silicon oxide layer 109, a force for physically maintaining the polymer 110*a* is weakened, because the silicon oxide 112 around the polymer 110*a* is almost removed. For this reason, the polymer 110*a* is detached or separated from the silicon oxide layer 109. Thus, a small amount of the silicon oxide 112 attached to the polymer 110*a* is detached or separated. As a result, as shown in FIG. 3E, the silicon oxide layer 109 is removed. After that, processes of cleaning the wafer and the like are performed, and an electrode is formed in the contact hole 107.

In accordance with the first embodiment as described above, the composite product 111 formed of the polymer 110 and the silicon oxide layer 109 is first irradiated with UV light, and subsequently, cleaned with HF steam, thereby removing the polymer 110 and the silicon oxide layer 109 to some extent. Then, the wafer W is heated, whereby the remaining polymer 110*a* is gasified, thereby shrinking the volume of the polymer 110*a*. In this state, since cleaning by HF steam is performed again, the HF steam easily reaches to the silicon oxide layer 109, and for this reason, the silicon oxide 112 and the polymer 110*a* are also removed as described. As a result, the silicon oxide layer 109 is easily removed. Accordingly, when an electrode is subsequently formed in the contact hole 107, an increase in contact resistance can be suppressed, and the yield of semiconductor devices can be improved.

By performing a series of the above-described steps, the composite product 111 is sufficiently removed. However, as apparent in embodiments which will be described later, after these steps, a heating step may also be performed and HF cleaning may subsequently be performed.

Moreover, the UV irradiation step (Step S12) and the HF steam cleaning step (Step S13) may be repeated two or more times.

Further, after the UV irradiation step, the heating step may be performed without performing the HF steam cleaning step of Step S13. In this case, there is an advantage in that the subsequent HF steam cleaning step (Step S15) can be effectively performed, because the polymer 110*a* has been shrunk by the heating.

Moreover, if the UV irradiation step is performed two or more times, the heating of the wafer W need not be performed in the second and later UV irradiation steps, because the polymer 110 of the thick film has already been removed in the first UV irradiation step.

Second Embodiment

Hereinafter, a second embodiment of the substrate processing method in accordance with the present invention will be described.

Figure 5:
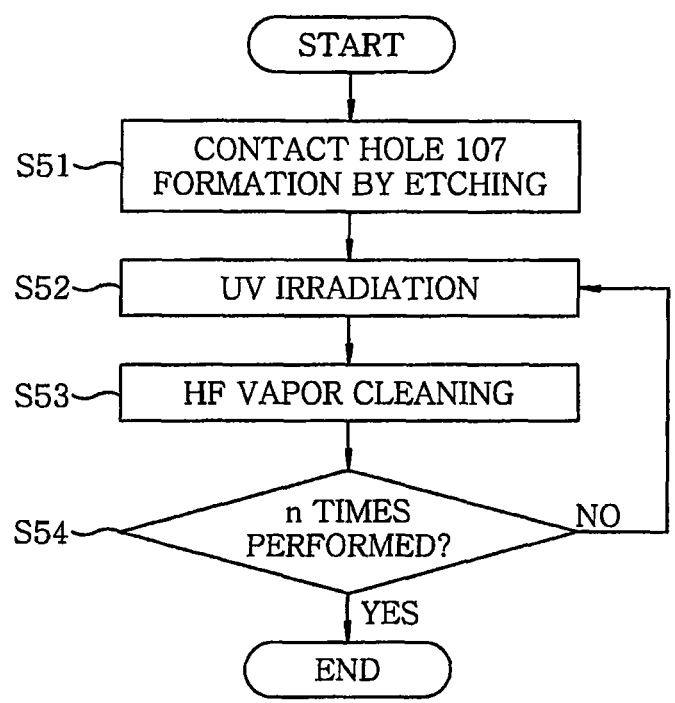
FIG. 5 is a process flowchart of a second embodiment of the present invention.

In this embodiment, the following process is performed on a wafer W having the structure of FIG. 2A on the surface thereof. FIG. 5 shows a process flowchart of this embodiment, and FIGS. 6A to 6E schematically show cross sectional views of a bottom of the contact hole 107 in the wafer W in respective steps.

(Step S51: Step of Etching Silicon Oxide Film 101)

Etching is performed in the same manner as in the above-described Step S11. By such etching, the composite product 111 is formed on the bottom of the contact hole 107.

(Step S52: UV Irradiation Step)

Figure 6A:
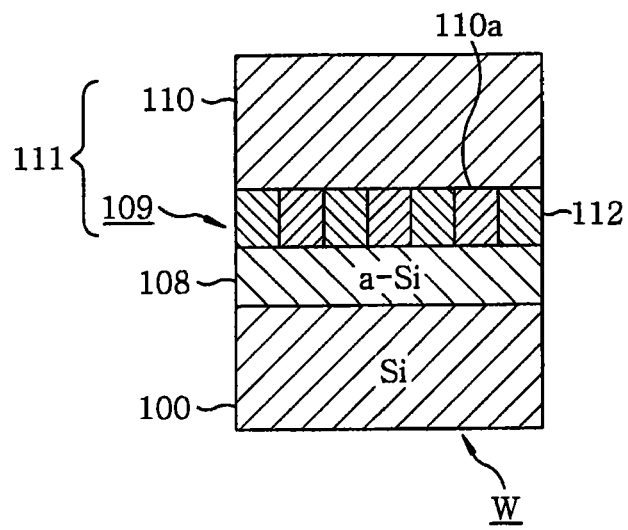
FIGS. 6A to 6E schematically show cross-sectional views of the bottom of a contact hole in a substrate when respective steps of the second embodiment are performed.
Figure 6B:
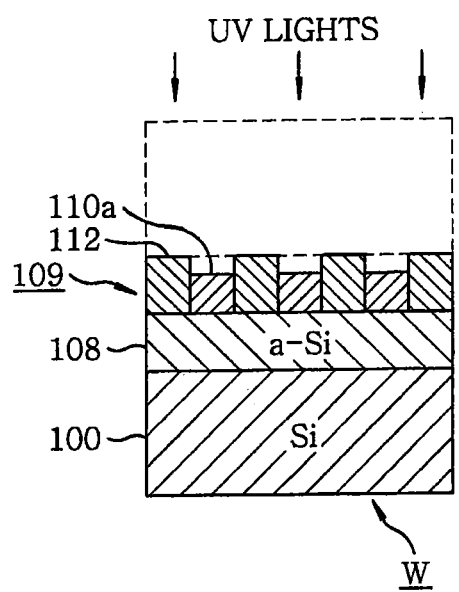

In the same manner as in the above-described Step S12, the wafer W is irradiated with UV light, while the wafer W is heated. As a result, as shown in FIG. 6B, the polymer 110 and the exposed polymer 110*a* in the surface of the silicon oxide layer 109 are removed, and thus the ratio of the silicon oxide 112 in the surface of the silicon oxide layer 109 increases.

(Step S53: Step of Cleaning with HF Steam)

Figure 6C:
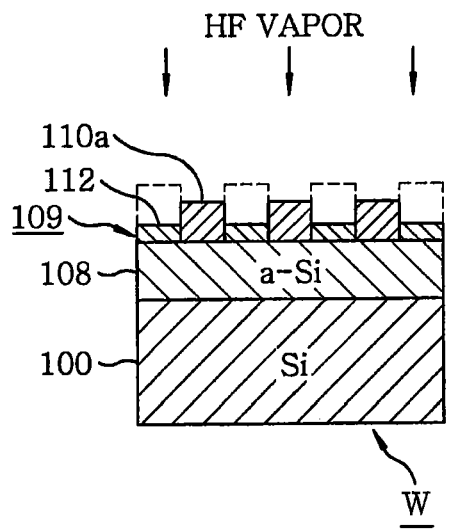

In the same manner as in the above-described Step S13, by supplying HF steam onto the wafer W, the exposed silicon oxide 112 in the silicon oxide layer 109 is removed. As a result, as shown in FIG. 6C, the ratio of the polymer 110*a* in the silicon oxide layer 109 increases.

(Step S54: Repeated Step)

Figure 6D:
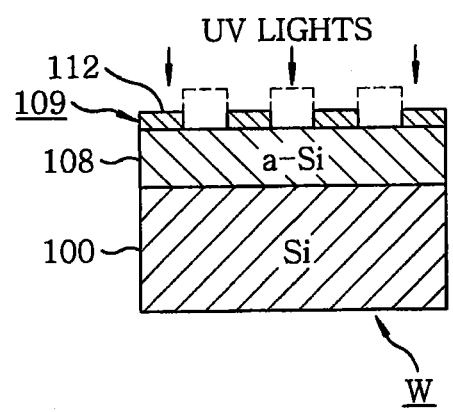
Figure 6E:
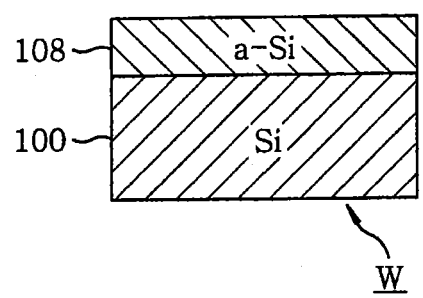

The above-described Step S52 and Step S53 are repeated a predetermined number of times. In this embodiment, a heating step corresponding to the above-described Step S14 is not performed; however, as shown in FIGS. 6D and 6E, the silicon oxide 112 and the polymer 110*a* are sequentially removed. Thus, the composite product 111 can be easily removed, so that an increase in contact resistance can be suppressed. Further, in the embodiment, the heating of the wafer W need not be performed in the second and later UV irradiation steps.

Third Embodiment

Hereinafter, a third embodiment of the substrate processing method in accordance with the present invention will be described.

Figure 7:
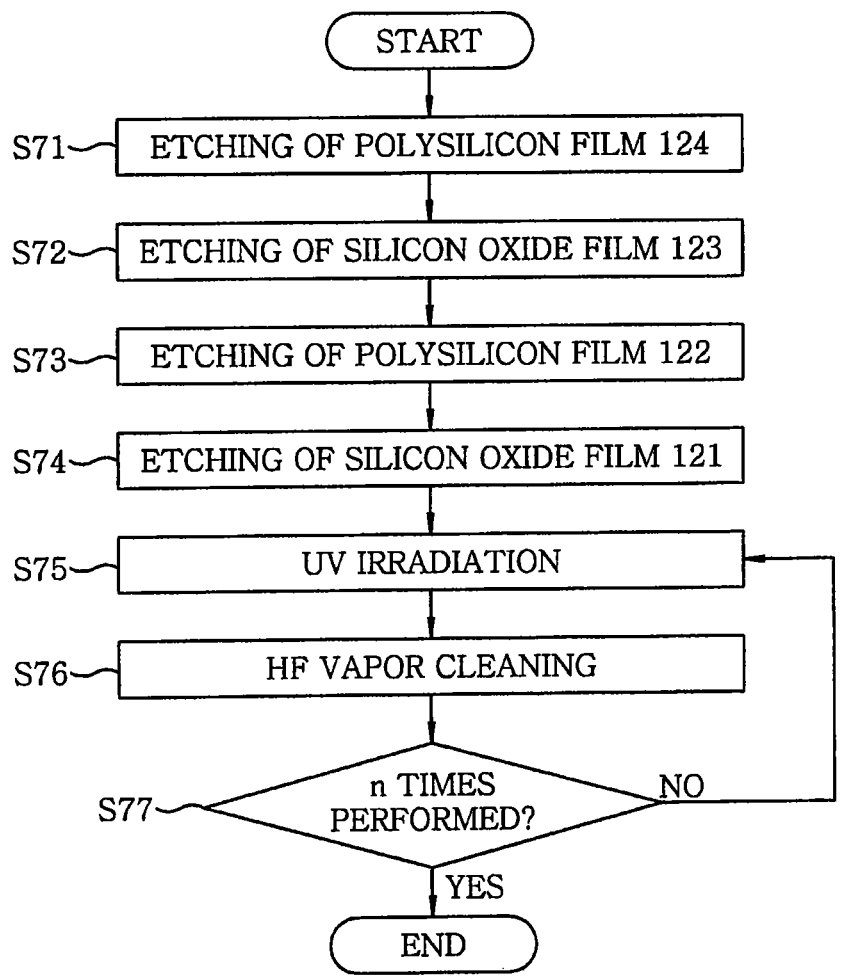
FIG. 7 is a process flowchart of a third embodiment of the present invention.
Figure 8A:
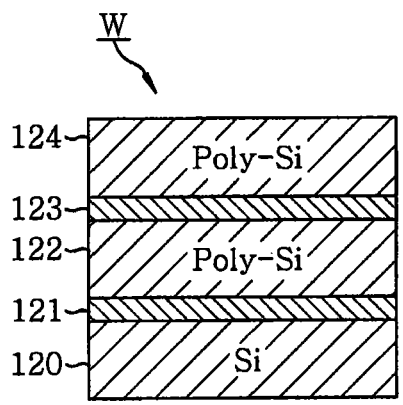
FIGS. 8A to 8F schematically show cross-sectional views of the bottom of a contact hole in a substrate when respective steps of the third embodiment are performed.
Figure 8B:
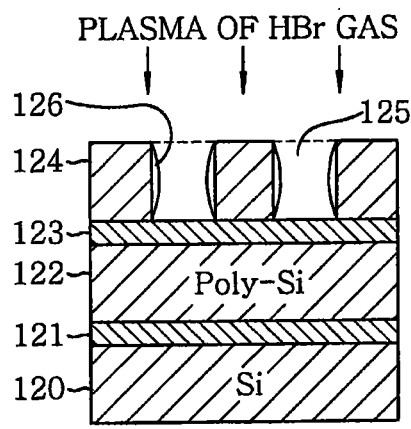

FIG. 7 shows a process flowchart in this embodiment. FIG. 8A shows a wafer W in which a silicon oxide film 121, a polysilicon film 122, a silicon oxide film 123 and a polysilicon film 124 are sequentially deposited on a silicon substrate 120. The following process is performed on the wafer W.

In this embodiment, the following steps are all performed in a vacuum atmosphere. Further, between the steps (during the transfer of the wafer W), the wafer W is kept in a vacuum atmosphere, such that it is not exposed to an atmospheric atmosphere.

(Step S71: Step of Etching Polysilicon Film 124)

In approximately the same manner as in Step S11, a gas containing halogen gas, for example, hydrogen bromide (HBr) gas, is converted to plasma, and as shown in 8B, the polysilicon film 124 is etched by the plasma to form recess 125. By such etching, a halogenated silicon oxide 126 which is an inorganic product resulting from the diffusion of bromine into silicon oxide is formed on the sidewall of the recess 125.

(Step S72: Step of Etching Silicon Oxide Film 123)

Figure 8C:
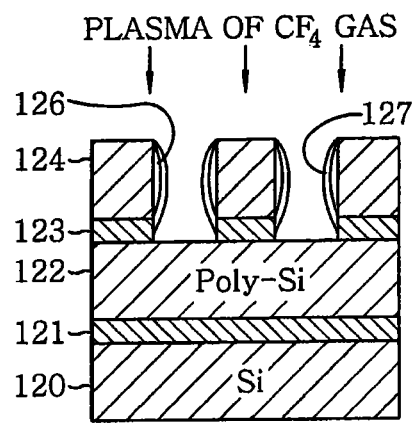

Then, in approximately the same manner as in the above-described Step S71, a gas containing carbon and fluorine, for example, $CF_4$ gas, is converted to plasma to etch the silicon oxide film 123 as shown in FIG. 8C. By such etching, a polymer 127 which is an organic product containing carbon and fluorine is formed on the above-described halogenated silicon oxide 126 in the sidewall of the recess 125.

(Step S73: Step of Etching Polysilicon Film 122)

Figure 8D:
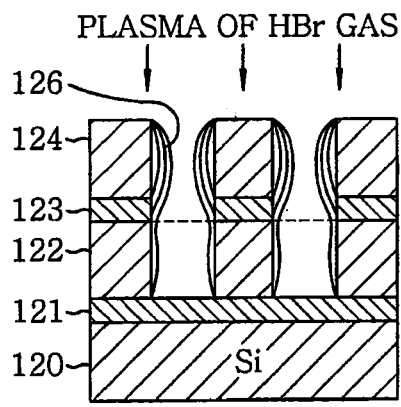

In the same manner as in the above-described Step S71, the polysilicon film 122 is etched as shown in FIG. 8D. By such etching, the halogenated silicon oxide 126 is formed again on the sidewall of the recess 125.

(Step S74: Step of Etching Silicon Oxide Film 121)

Figure 8E:
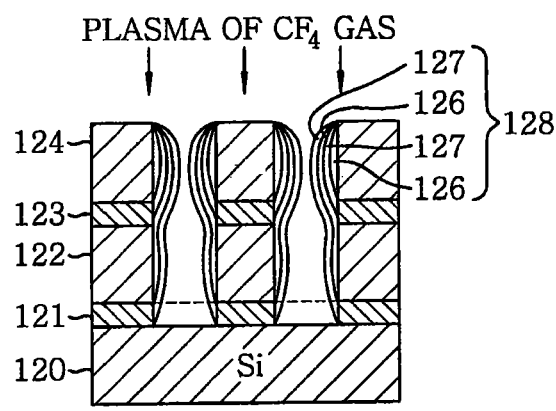

In the same manner as in the above-described Step S72, as shown in FIG. 8E, the silicon oxide film 121 is etched. By such etching, the polymer 127 is formed again on the sidewall of the recess 125.

As a result, on the sidewall of the recess 125, a laminate product 128 which is a laminate of the halogenated silicon oxide 126 and the polymer 127 is formed.

(Step S75: UV Irradiation Step)

Then, the same treatment as the UV irradiation step of Step S52 of the second embodiment is performed on the wafer W, whereby the polymer 127 on the surface of the recess 125 is removed. In this step, the heating of the wafer W need not be performed.

(Step S76: Step of Cleaning with HF Steam)

Subsequently, in the same manner as in the Step S53 of the second embodiment, HF steam is supplied onto the wafer W, so that the halogenated silicon oxide 126 on the recess 125 is removed.

(Step S77: Repeated Step)

Figure 8F:
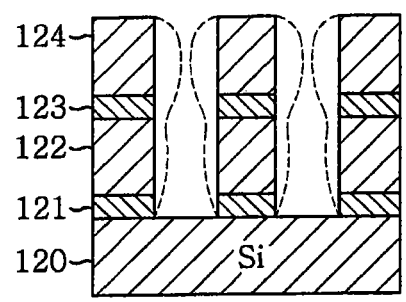

In the same manner as in Step S54 of the second embodiment, Step S75 and Step S76 are repeated a predetermined number of times. As a result, as shown in FIG. 8F, the laminate product 128 formed on the sidewall of the recess 125 is removed. In this embodiment, Step S75 and Step S76 are repeated twice. Then, for example, a step of cleaning the wafer W is performed, and an electrode or a metal wiring is formed in the recess 125.

In accordance with the third embodiment as described above, in the process for removing the laminate product 128 which is a composite product in which the halogenated silicon oxide 126 and the polymer 127 are alternately laminated, the transfer of the wafer W or each of the steps is performed in a vacuum atmosphere, so that the wafer W is not exposed to the atmospheric atmosphere. Therefore, the halogenated silicon oxide 126 can be removed, before the oxidation thereof progresses to form a stable material.

Further, a metal film formed in the recess 125 can be prevented from being oxidized by moisture absorption by halogen. Moreover, since the UV irradiation step and the HF steam cleaning step are repeated, the laminate product 128 can be removed in a simple and reliable manner. In this case, the repeat number of UV irradiation steps and HF steam cleaning steps may be determined depending on the number of portions to be etched, that is, the lamination number of silicon oxide films 121 and 123 and polysilicon films 122 and 124. If the number of layers laminated is 1, each of the steps need not be repeated.

In accordance with the embodiments of the present invention, the effects described in each of the embodiments can be obtained. The common advantage to the embodiments is that, even when the openings of the contact holes 107 and 125 are small, UV lights and HF steam can enter the contact holes 107 and 125, because UV lights and HF steam rather than a liquid such as an organic solvent or an acidic solution is used to remove the composite product 111 and the laminate product 128. Therefore, the composite product 111 and the laminate product 128 can be quickly removed. In addition, since a plasma of oxygen gas is not used, the oxidation of the silicon substrates 100 and 120 can be suppressed, and even if a SiOCH film containing silicon, carbon, fluorine and hydrogen, which is recently receiving attention as a low-dielectric film is included, a the SiOCH film is prevented from being ashed by oxygen.

As a process of removing the laminate product 128, the method of the first embodiment may be applied.

[Configuration of the Apparatus]

Hereinafter, an example of a substrate processing apparatus for performing the substrate processing method in accordance with the present invention will be briefly described with reference to FIG. 9.

Figure 9:
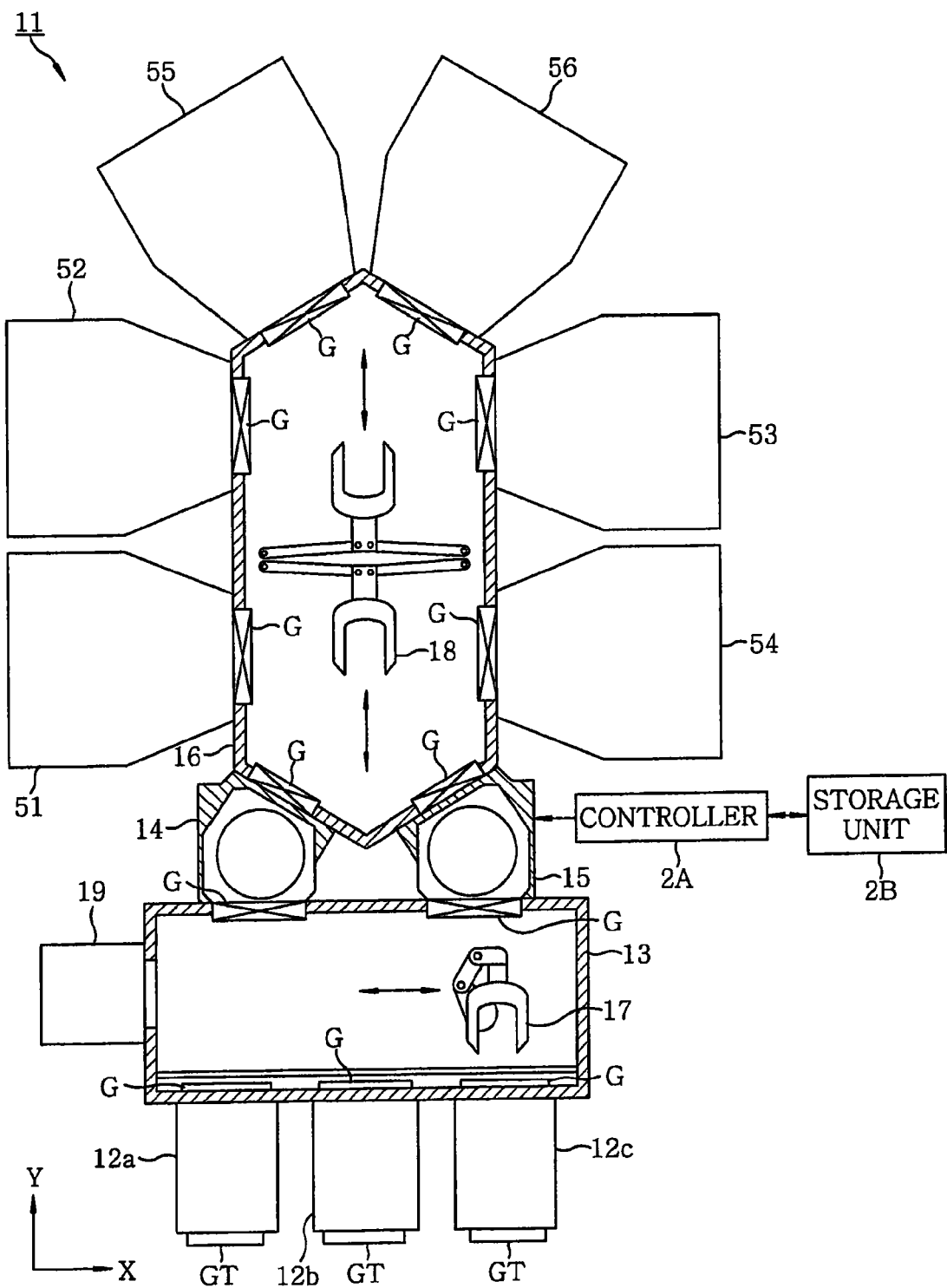
FIG. 9 is a horizontal cross-sectional view showing a first embodiment of a substrate processing apparatus in accordance with the present invention.

A substrate processing apparatus 11 shown in FIG. 9 is a multi-chamber system for performing the above-described substrate processing and includes carrier chambers 12a to 12c, a first transfer chamber 13 that is a loader module, load-lock chambers 14 and 15, and a second transfer chamber 16 that is a substrate transfer module. To the second transfer chamber 16, plasma processing devices 51 to 54 that are processing modules, a UV irradiation device 55 that is a UV processing and heating module, and a HF cleaning device 56 that is a hydrogen fluoride module are airtightly connected to communicate with each other. Further, at one side of the first transfer chamber 13, an alignment chamber 19 is provided. Each of the load-lock chambers 14 and 15 includes a vacuum pump and a leak valve (not shown), and the inside of the load-lock chambers can be changed-over between an atmospheric atmosphere and a vacuum atmosphere. That is, since the first transfer chamber 13 and the second transfer chamber 16 can be kept under the atmospheric atmosphere and the vacuum atmosphere, respectively, the load-lock chambers 14 and 15 can adjust the atmosphere to which the wafer W is exposed during the wafer transfer between the first and second transfer chambers 14 and 15.

The first and second transfer chambers 13 and 16 include a first transfer unit 17 and a second transfer unit 18, respectively. The first transfer unit 17 is a transfer arm for carrying out the transfer of the wafer W between the carrier chamber 12a, 12b or 12c and the load-lock chamber 14 or 15 and between the first transfer chamber 13 and the alignment chamber 19. The second transfer unit 18 is a transfer arm for carrying out the transfer of the wafer W between the load-lock chamber 14 or 15, the plasma processing device 51, 52, 53 or 54, the UV irradiation device 55 and the HF cleaning device 56.

Figure 10:
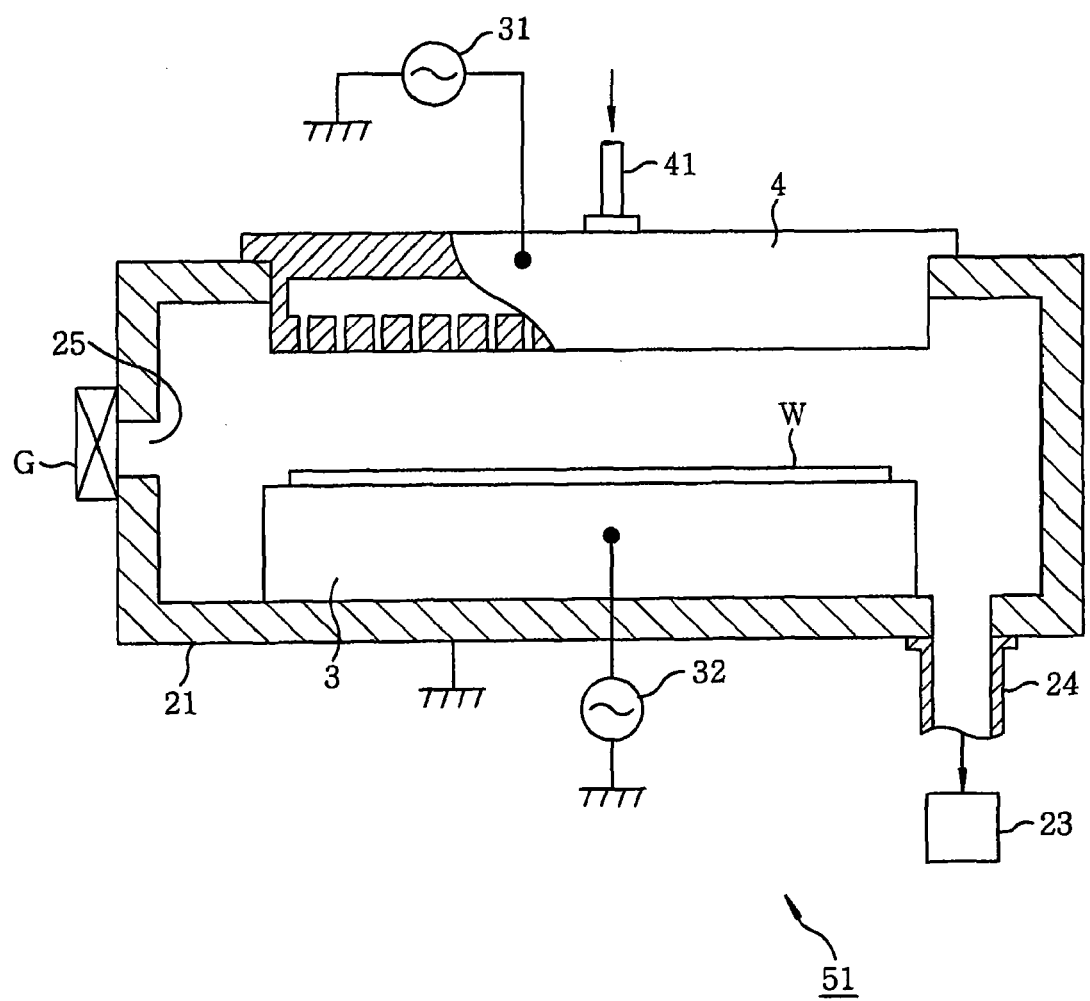
FIG. 10 is a longitudinal cross-sectional view of a plasma processing apparatus which is used in the plasma processing of the present invention.

For the plasma processing device 51, 52, 53 or 54, for example, a plasma processing device of parallel plate type known in the art can be used. An example of the configuration thereof is shown in FIG. 10. The plasma processing device 51 includes a processing chamber 21, the inside thereof being kept in a vacuum. In the processing chamber 21, a mounting table 3 disposed in the central portion of the bottom of the processing chamber 21 and serving as a lower electrode, and an upper electrode 4 forming a gas showerhead provided in the ceiling portion of the processing chamber 21, are provided to face each other.

Further, the processing chamber is configured such that a processing gas is introduced through a processing gas inlet line 41 via the upper electrode 4 into the processing chamber 21 to be converted into a plasma by applying a high frequency power from a high frequency power supply 31 between the mounting table 3 and the upper electrode 4. Furthermore, the processing chamber is configured such that etching is performed on the wafer W electrostatically attracted to the mounting table 3 by introducing ions of the plasma to the wafer W by applying a high frequency power from a bias power supply 32. In FIG. 10, reference numeral 24 denotes a gas exhaust line, 23 is a vacuum pump, 25 is a wafer transfer port, and G is a gate.

In the plasma processing device 51, when the wafer W is loaded into the processing chamber 21 from the transfer port 25 by the second transfer unit 18 and mounted on the mounting table 3, the inside of the processing chamber 21 is vacuum-evacuated via a gas exhaust line 24 by the vacuum pump 23. Then, the plasma processing (etching) is performed by the plasma of the processing gas. The processing gas may also contain argon (Ar) or the like as a dilution gas.

Figure 11:
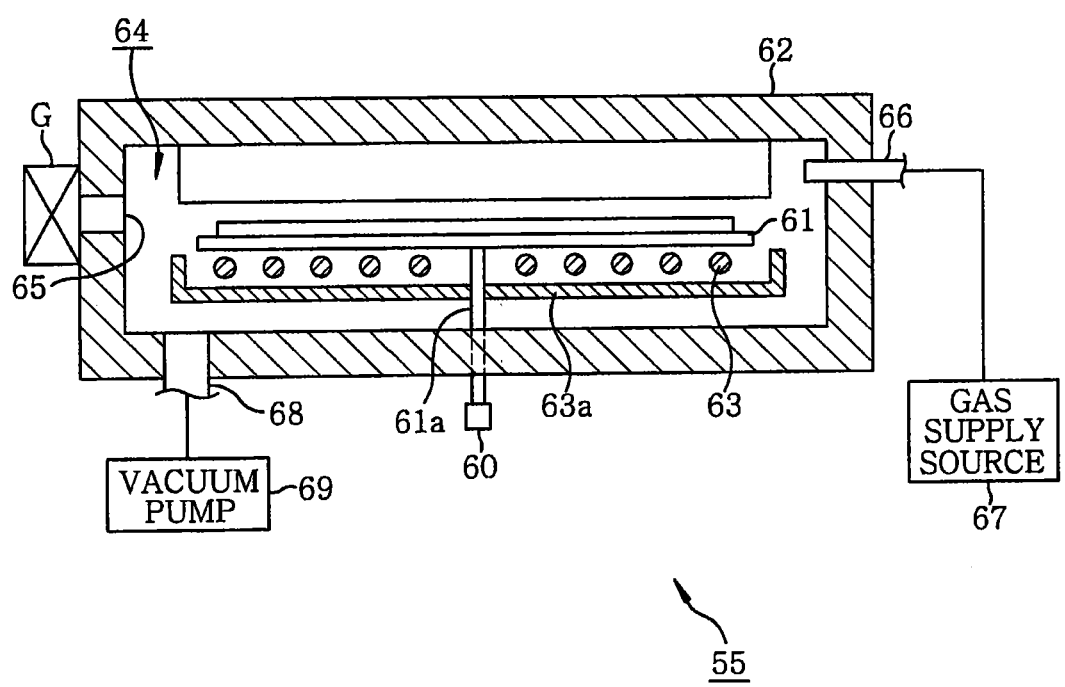
FIG. 11 is a longitudinal cross-sectional view showing an example of a UV irradiation device which is used in a UV irradiation step of the present invention.

The UV irradiation device 55 is described with reference to FIG. 11. The UV irradiation device 55 includes, in a processing chamber 62 which can be kept in a vacuum, a mounting table 61 made of a transparent material, for example, quartz, and capable of attracting the wafer W, halogen lamps 63 provided below the mounting table 61 and serving as a unit for heating the wafer W, and a UV lamp unit 64 provided above the mounting table 61. Since the UV irradiation device 55 includes the heating unit, it also serves as a heating device for heating the wafer W (e.g., Step S14 of FIG. 1).

The mounting table 61 is supported on the bottom of the processing chamber 62 by a support 61a and can be rotated by, for example, a motor 60 connected to the support 61a. The halogen lamps 63 formed of five annular lamps are connected to a power supply (not shown) and fixed in an approximately cylindrical reflector 63a which opens upward. Further, the processing chamber 62 includes a measurement device for measuring the temperature of the wafer W mounted on the mounting table 61. Based on the measurement results obtained by the measurement device, the output of the halogen lamps can be controlled.

The UV lamp unit 64 is connected to a power supply (not shown) and includes, for example, a plurality of UV irradiation tubes. A gas supply port 66 is provided at one side of the processing chamber 62, and, for example, nitrogen gas is supplied into the processing chamber 62 from a gas supply source 67 through the gas supply port. At the bottom of the processing chamber 62, a gas exhaust port 68 is formed, and the internal atmosphere of the processing chamber 62 can be evacuated by a vacuum pump 69. Further, at a side of the processing chamber 62, a transfer opening 65 for the wafer is formed so that it can be opened or closed by a gate G. Furthermore, the UV lamp unit 64 may include, for example, a plurality of annular radiation tubes having different diameters.

In the UV irradiation device 55, when the wafer W is loaded into the processing chamber 62 through the transport opening 65 and mounted on the mounting table 61, the mounting table 61 is rotated by the motor 60, and the inside of the processing chamber 62 is vacuum-evacuated by the vacuum pump 69. At this time, for example, nitrogen gas is supplied from the gas supply source 67, and in this state, the above-described UV irradiation step or heating step is performed on the wafer W. That is, in the UV irradiation step, the wafer W is irradiated with UV lights from the UV lamp unit 64, and in the heating step, the wafer W is heated by the halogen lamps 63.

Figure 12:
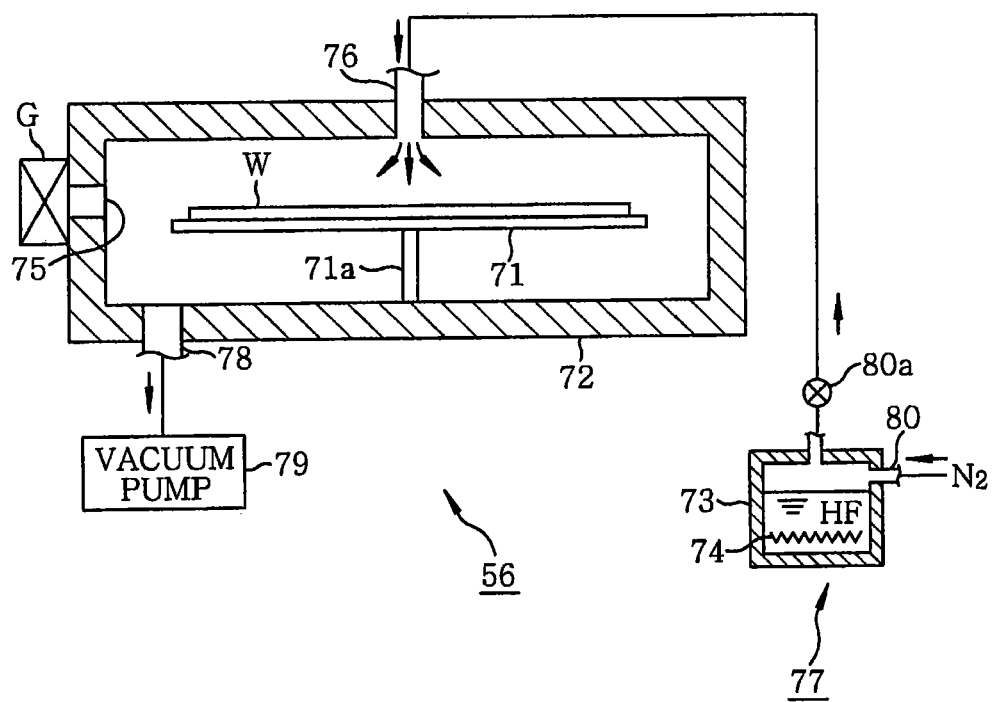
FIG. 12 is a longitudinal cross-sectional view showing an example of an HF steam cleaning unit which is used in an HF steam cleaning step of the present invention.

The HF cleaning device 56 is described with reference to FIG. 12. The HF cleaning device 56 includes a processing chamber 72 and a mounting table 71 fixed to the bottom of the processing chamber 72 by a support 71a. At the top surface of the processing chamber 72, an HF steam supply port 76 is formed to face the mounting table 71. The HF steam supply port 76 is connected to an HF supply source 77 for supplying HF steam via a valve 80a. The HF supply source 77 includes a storage tank 73 for storing HF solution. The storage tank 73 includes a heater 74 for evaporating the HF solution. Further, a carrier gas supply port 80 for supplying a carrier gas is formed in the storage tank 73, and the storage tank 73 is configured such that a carrier gas such as nitrogen gas can be supplied into the storage tank 73, and the HF steam evaporated by the heater 74 can be supplied into the processing chamber 72. At the bottom of the processing chamber 72, a gas exhaust port 78 is formed, so that the atmosphere of the processing chamber 72 can be evacuated by the vacuum pump 79. Further, at a side of the processing chamber 72, a transfer opening 75 for the wafer W is formed so that it can be opened or closed by the gate G.

In the HF cleaning device 56, when the wafer W is loaded into the processing chamber 72 through the transfer opening 75 and mounted on the mounting table 71, the inside of the processing chamber 72 is evacuated by the vacuum pump 79. Then, the HF solution in the storage tank 73 is heated by the heater 74 to form HF steam and is supplied for a predetermined time into the processing chamber 72 from the HF supply source 77 by using nitrogen gas as carrier gas. Therefore, the above-described HF steam cleaning step is carried out.

As shown in FIG. 9, the substrate processing apparatus 11 includes a controller 2A which is, for example, a computer. The controller 2A includes a data processing module made up of a program, memory, a CPU, and the like. The program includes instructions so that it transmits a control signal from the controller 2A to each unit of the substrate processing apparatus 11 to perform a corresponding step. Further, the memory has a region in which processing parameter values, including a processing pressure, a processing temperature, a processing time, a gas flow rate a power value and the like are stored. Therefore, when the CPU executes each instruction, the processing parameters are read, and control signals corresponding to the parameter values thereof are transmitted to respective units of the substrate processing unit 11. For example, the program (also including program relating to the input operation or display of the processing parameters) is stored in a storage unit 2B which is a computer-readable storage medium, for example, flexible discs, compact discs, hard discs or magneto-optical discs (MO), and is installed in the controller 2A.

(Flow of Wafer (W))

Hereinafter, the flow (movement) of the wafer W when carrying out each of the above-described steps in the substrate processing apparatus 11 will be described.

First, a carrier which is a container for transferring a wafer W is loaded into one of the carrier chambers 12a to 12c from the outside through a gate door GT. Then, the wafer W is loaded into the first transfer chamber 13 from the carrier by the first transfer unit 17. Then, the wafer W is transferred to the alignment chamber 19 in which the direction or eccentricity of the wafer W is controlled. Then, the wafer W is transferred into the load-lock chamber 14 (or 15). Once the internal pressure of the load-lock chamber 14 is adjusted, the wafer W is transferred into the plasma processing device 51 via the second transfer chamber 16 from the load-lock chamber 14 by the second transfer unit 18. In the plasma processing device 51, the above-described plasma processing is carried out. Then, the wafer W is unloaded from the plasma processing device 51 by the second transfer unit 18 and transferred into the UV irradiation device 55 or the HF cleaning device 56, in which the above-described UV irradiation or HF cleaning is carried out. Then, the wafer W is returned to the carrier by following a reversed route to that when the wafer was loaded (wafer unloading).

After performing the plasma processing, the wafer W is transferred in a vacuum atmosphere, and then the UV irradiation step and steam cleaning step are respectively performed in the processing chamber 62 and in the processing chamber 72 each of which has been vacuum-evacuated. However, in the first and second embodiments, the wafer W may be exposed to an atmospheric atmosphere after the plasma processing. An example of an apparatus having such configuration is described with reference to FIG. 13 below.

Figure 13:
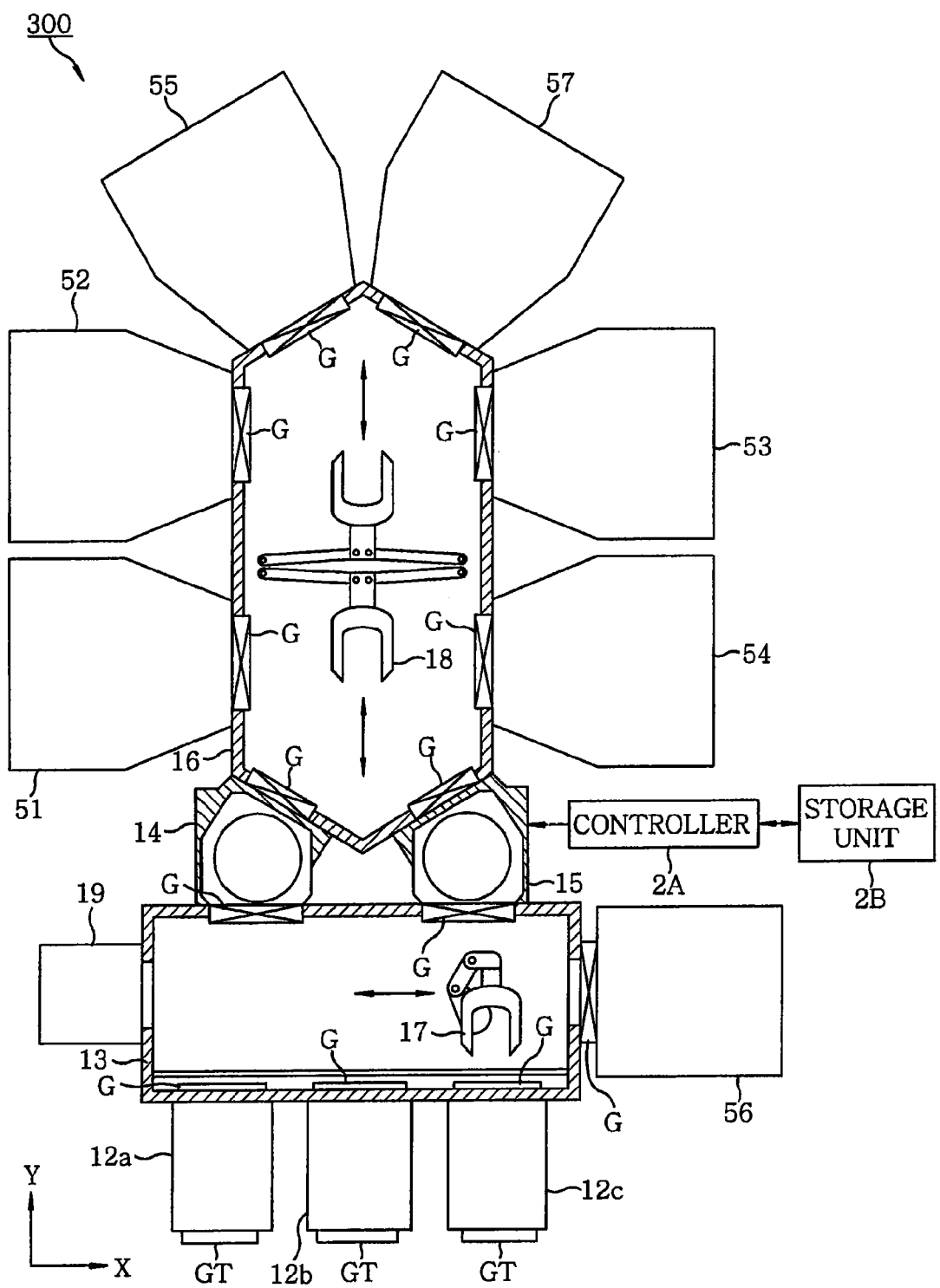
FIG. 13 is a horizontal cross-sectional view showing another embodiment of a substrate processing apparatus in accordance with the present invention.

FIG. 13 shows a substrate processing apparatus 300 which is an example of the apparatus applicable in the first and second embodiments. In the substrate processing apparatus 300, the HF cleaning device 56 is connected to the first transfer chamber 13, and a new plasma processing device 57 is connected to the second transfer chamber 16 instead. Except for this, the substrate processing apparatus 300 has the same configuration as the substrate processing apparatus 11 shown in FIG. 9. In the substrate processing apparatus 300, like parts are indicated by like reference numerals as used in the substrate processing apparatus 11.

The HF cleaning device 56 is connected to the first transfer unit 13 via the gate G. Further, the HF cleaning device 56 includes a leak valve (not shown). By the leak valve and the above-described vacuum pump 79, the inside of the processing chamber 72 can be switched between an atmospheric atmosphere and a vacuum atmosphere.

The operation of the substrate processing apparatus 300 will now be briefly described. Steps in this embodiment are the same as those in the first and second embodiments except for the HF steam cleaning step. In the HF steam cleaning step, the wafer W is processed in the following manner.

(HF Steam Cleaning Step)

In the substrate processing apparatus 300, the wafer W is transferred from the second transfer chamber 16 to the first transfer chamber 13 of an atmospheric atmosphere via the route reversed to that when the wafer W was loaded into the above-described substrate processing apparatus 11. Then, the wafer W is mounted on the mounting table 71 in the HF cleaning device 56 by the first transfer unit 17. Thereafter, the output of the vacuum pump 79 and the flow rate of nitrogen gas are controlled so that the internal pressure of the processing unit 72 becomes an atmospheric atmosphere, while the same processing as the above-described HF steam cleaning step is performed. After HF steam has been supplied for a predetermined time, a valve 80a is closed to stop the supply of HF steam, and the gas in the processing chamber 72 is evacuated by the vacuum pump 79. After the inside of the processing chamber 72 is changed to an atmospheric atmosphere by adjusting a leak valve (not shown), the wafer W is unloaded by the first transfer unit 17 and subjected to a next process.

In the substrate processing apparatus 300 as described above, although the HF steam cleaning step is performed in an atmospheric atmosphere, the UV irradiation step may also be performed in an atmospheric atmosphere by connecting the UV irradiation device 55 to the first transfer chamber 13. Further, both steps may be performed in an atmospheric atmosphere.

In the above-described substrate processing apparatus 11 and substrate processing apparatus 300, the halogen lamps 63 as heating unit are provided in the UV irradiation device 55 to perform the heating step in the UV irradiation device 55 where the UV irradiation step is performed. For this reason, the units for performing the UV irradiation step and the heating step need not be provided separately, and the installation area of the substrate processing apparatus 11 or 300 can be minimized. Each of the units may also be provided separately.

Further, although one UV irradiation device 55 and one HF cleaning device 56 have been installed, two or more UV irradiation devices 55 and two or more HF cleaning devices 56 may also be provided. Furthermore, although the UV irradiation device 55 and the HF cleaning device 56 have been provided separately, a configuration in which the UV irradiation step and the HF cleaning step are performed in one unit may be adopted. In this case, each internal component of the unit is preferably made of a material which is not deteriorated or corroded by either UV lights or HF steam.

Further, a silicon oxide 112 (or halogenated silicon oxide 126) and a polymer 110 (or a polymer 127) are deposited to the internal components of the processing chamber 21 in the plasma processing device 51 by etching similarly to the surface of the wafer W. In this case, these components may be cleaned in the same manner as the cleaning step of the above-described embodiments after separating the components and loading the separated components into the UV irradiation device 55 and the HF cleaning device 56. In this case, when the HF steam cleaning is performed, the processing time or the number of times of processing is suitably controlled so that the materials attached to each component are removed without corroding them.

Figure 14:
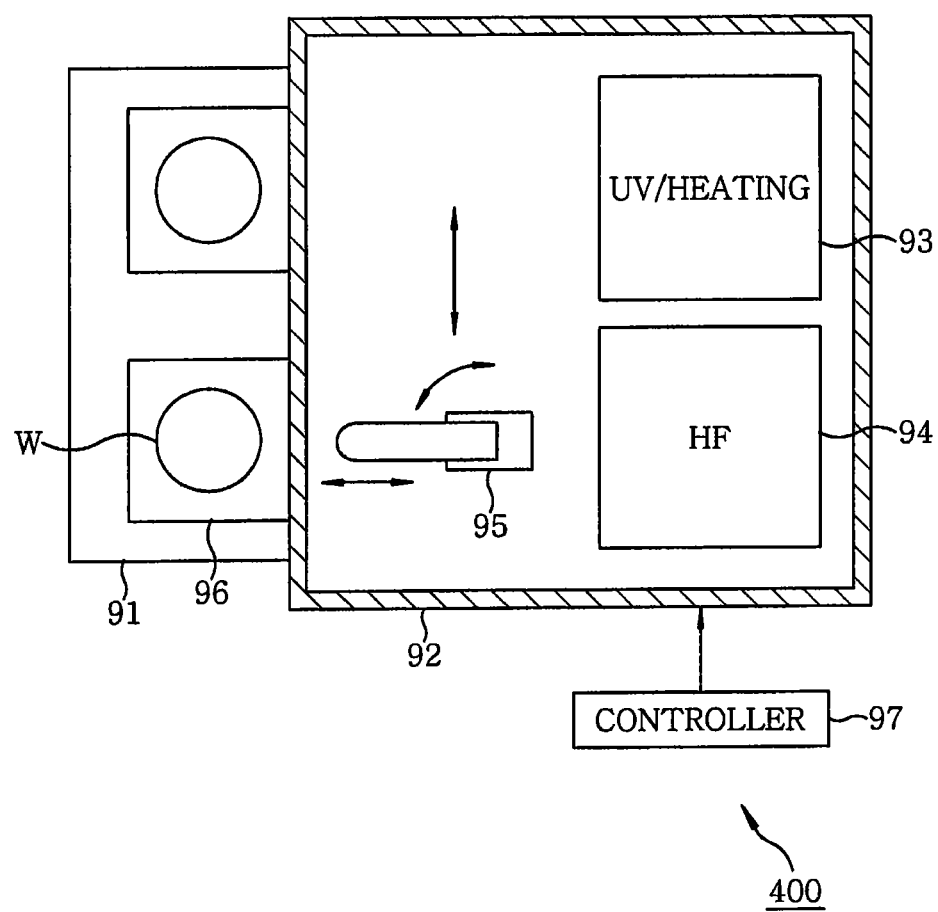
FIG. 14 is a horizontal cross-sectional view showing still another embodiment of a substrate processing apparatus in accordance with the present invention.

The substrate processing apparatus of the present invention is not limited to the configuration in which it is included in the above-described multi-chamber system. For example, the substrate processing apparatus may be configured as a stand-alone type apparatus which is separated from the plasma processing device 51 and performs processing in a vacuum atmosphere. As an example thereof, a substrate processing unit 400 is shown in FIG. 14. In FIG. 14, reference numeral 91 denotes a carrier stage, and 92 is a housing forming the body of the apparatus. The housing 92 includes a UV processing module 93 serving also as a heating module, an HF processing module 94 and a transfer arm 95. In this embodiment, the wafer W in a FOUP (closed carrier) 96 loaded onto a carrier stage 91 is unloaded by a transfer arm 95 and is transferred sequentially to the modules 93 and 94, so that the above-described steps are respectively performed in the modules based on the control signal from the controller 97. After each step, the wafer is returned to the FOUP 96. Further, the atmosphere in the substrate processing apparatus 400 may be an atmospheric atmosphere as described in the first and second embodiments.

Experimental Example 1

An experiment carried out in the present invention will now be described. In the experiment, a substrate processing apparatus for an experiment was used and an experimental wafer W having a silicon oxide film 101 formed on a silicon substrate 100 was used. A process of etching the silicon oxide film 101, corresponding to Step S11 of the first embodiment, was performed on the wafer W, thereby forming a contact hole 107. Then, the processes shown in Table 1 below were performed on the wafer W. Herein, in the initial UV irradiation step, UV lights were irradiated for 360 seconds, while the wafer W was heated to 200° C. Meanwhile, in the subsequent UV irradiation step, UV lights were irradiated for 300 seconds. Further, in the HF steam cleaning step, HF steam was supplied for 1 hour, and in the heating step, heat treatment was carried out at 300° C. in air for 1 hour.

After each of the treatments has been performed, the contact angle of water on the surface of the silicon oxide layer 109 was measured by a contact angle meter. The silicon oxide 112 has a hydrophilic property, while the polymer 110a containing carbon and fluorine has a hydrophobic property, and thus it is considered that the ratio between the silicon oxide 112 and the polymer 110a can be evaluated by measuring the contact angle of water. Further, since the amorphous silicon layer 108 formed under the silicon oxide layer 109 has a hydrophobic property, it is considered that the contact angle of water shows the highest value when the silicon oxide layer 109 is removed. That is, it is considered that, in the silicon oxide layer 109 formed of a mixture of the hydrophobic material (polymer 110a) and the hydrophilic material (silicon oxide 112), the contact angle of water shows an intermediate value between the values of both materials. However, it is considered that, if the silicon oxide layer 109 is removed, a monolayer of a material having water repellency (amorphous silicon layer 108) remains, and therefore the contact angle of water becomes the largest. Table 1 shows the treatments conducted in the experiment and the measurement results of water contact angle in those treatments.

TABLE 1

Change in water contact angle

| Treatment sequence | 1 | 2 | 3 | 4 | 5 | 6 |
|---|---|---|---|---|---|---|
| | | | | | units: degrees | |
| Example 1-1 | UV | HF | Heating | HF | | |
| | 21 | 53 | 21 | 70 | | |
| Example 1-2 | UV | HF | UV | HF | Heating | HF |
| | 21 | 53 | 6 | 56 | 35 | 65 |
| Example 1-3 | UV | HF | UV | HF | UV | HF |
| | 21 | 53 | 6 | 56 | — | 62 |
| Example 1-4 | UV | Heating | HF | | | |
| | 21 | 3 | 52 | | | |
| Comparative Example 1-1 | UV | HF | Heating | | | |
| | 21 | 53 | 21 | | | |
| Comparative Example 1-2 | UV | HF | UV | | | |
| | 21 | 53 | 6 | | | |

UV: UV irradiation, HF: HF steam cleaning

As shown in Table 1, the contact angle of water on the surface of the silicon oxide layer 109 was greatly changed by the UV irradiation step and the HF steam cleaning step. That is, when the polymer 110a on the surface of the wafer W is removed by UV irradiation, the ratio of the silicon oxide 112 increases, and thus hydrophilic property is shown (the contact angle of water becomes smaller), whereas, when the silicon oxide 112 is removed by HF steam cleaning, the ratio of the polymer 110a increases, and the hydrophobic property is shown (the contact angle of water become larger). Further, it can be seen that, whenever the HF steam cleaning step was carried out, the silicon oxide layer 109 was slowly removed, because the contact angle of water became larger. In the fourth HF steam cleaning step of Example 1-1, the contact angle of water was increased to 70 degrees. This is considered to be a state in which the silicon oxide layer 109 was almost removed.

As shown in Table 1, Example 1-2, Example 1-3 and Comparative Examples showed water contact angles smaller than those of Example 1-1. Thus, it is considered that the silicon oxide layer 109 can also be removed (the contact angle of water can be increased to 70 degrees) by performing the UV irradiation step and the HF steam cleaning step and then repeating these steps. Further, when the wafer W treated in Example 1-1 was left in the air, the contact angles of water were decreased to 50 degrees and 46 degrees after 2 days and 13 days, respectively. This is considered to be due to the influence of the water of the air.

Example 2

Figure 15A:
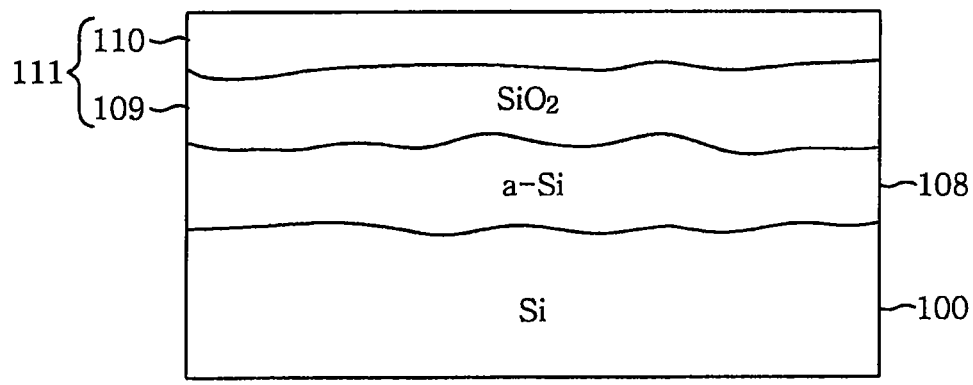
FIGS. 15A to 15C are schematic views showing TEM photographs of a cross-section of a substrate in an embodiment of the present invention.

On the wafer W having the same configuration as in Experimental Example 1, the etching of the silicon oxide film was performed. A TEM of (×1,000,000) of the bottom of the contact hole 107 is schematically shown in FIG. 15A. It was observed that the composite product formed of the polymer 110 and the silicon oxide layer 109 was formed, because the polymer 110 on the silicon oxide layer 109 was entered into the silicon oxide layer 109 in the form of the polymer 110a. Then, treatments shown in Table 2 were performed on the wafer W.

TABLE 2

| Treatment sequence | | 1 | 2 | 3 | 4 |
|---|---|---|---|---|---|
| Example 2 | Step Conditions | UV 360 sec, 200° C. | HF 2 h | Heating 1 h, 300° C. | HF 2 h |
| Comparative Example 2 | Step Conditions | UV 360 sec, 200° C. | HF 2 h | UV 300 sec | |

Figure 15B:
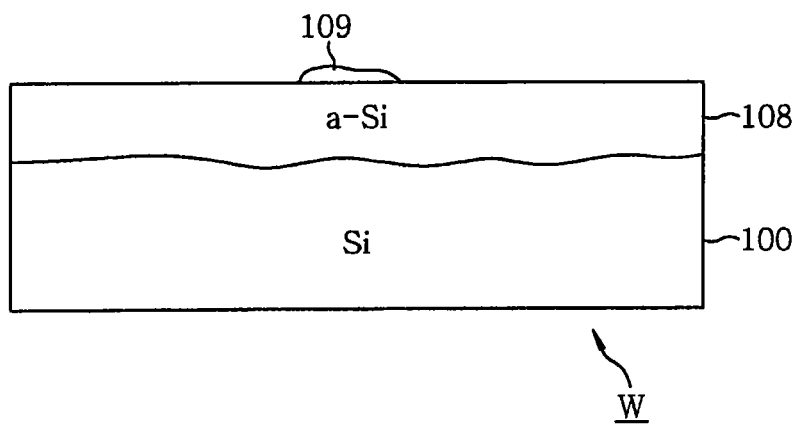
Figure 15C:
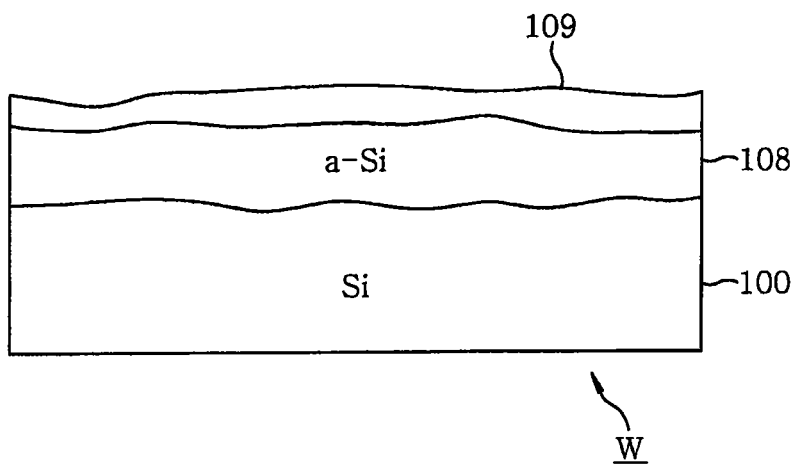
Figure 16:
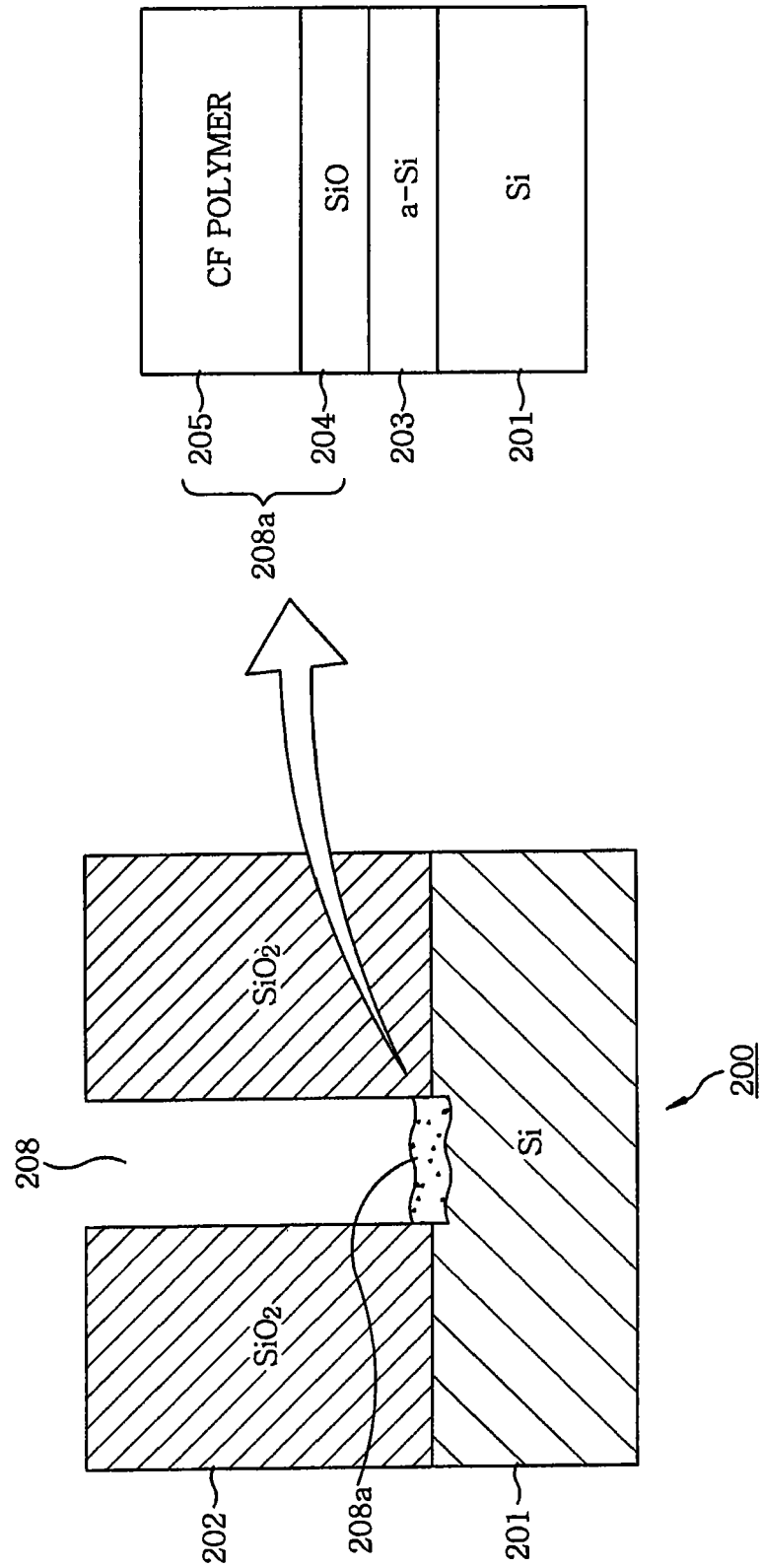
FIG. 16 is a view showing a composite product formed by etching.
Figure 17A:
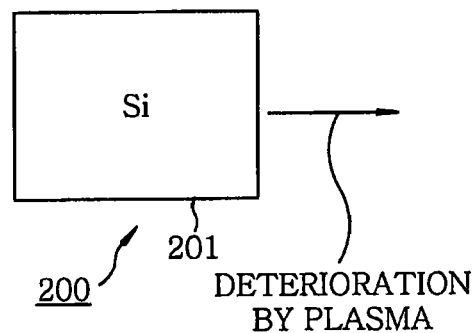
FIGS. 17A to 17D are views showing a process in which the composite product of FIG. 16 is formed.
Figure 17B:
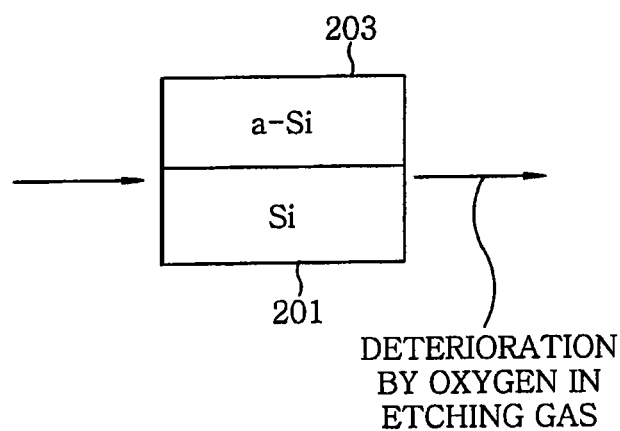
Figure 17C:
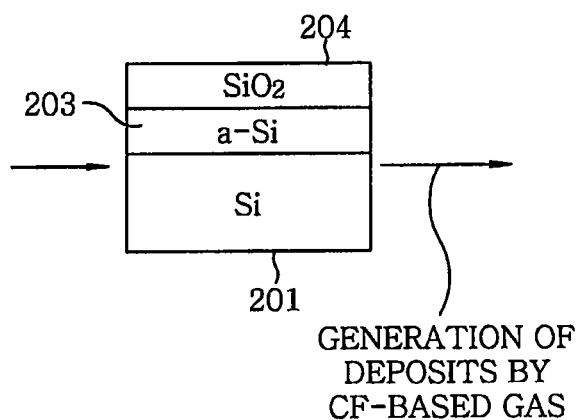
Figure 17D:
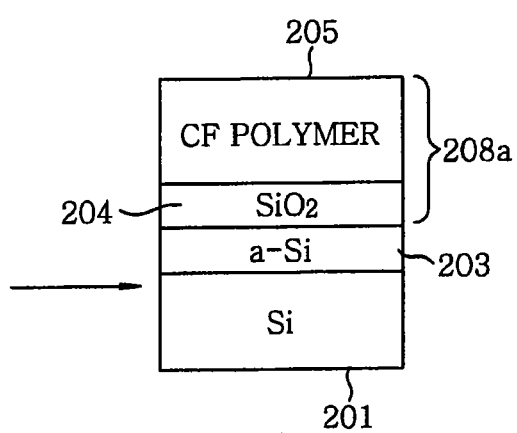

TEM photographs of the bottoms of the wafers F of Example 2 and Comparative Example 2 after the above treatments were performed are schematically shown in FIGS. 15B and 15C. By a series of treatments in Example 2, the composite product 111 was almost removed, and thus a small amount of the silicon oxide layer 109 was barely observed in the wafer W. Therefore, it is considered that, in Example 1-1 in which substantially same treatment as Example 2 was performed, the silicon oxide layer 109 was also almost removed. Meanwhile, in Comparative Example 2, it was observed that a half of the initial thickness of the silicon oxide layer 109 was remained.

What is claimed is:

1. A substrate processing method comprising the sequential steps of:
    a) forming a composite product on a surface of a substrate, a silicon oxide film being formed on the surface of the substrate and the composite product being formed of an inorganic material containing silicon oxide and an organic material containing carbon and fluorine;
    b) irradiating ultraviolet rays on the surface of the substrate to remove at least a part of the organic material until a proportion of the inorganic material in the composite product is greater than that of the organic material in the composite product; and
    c) supplying hydrogen fluoride steam onto the surface of the substrate to remove at least a part of the inorganic material until a proportion of the organic material in the composite product is greater than that of the inorganic material in the composite product;
    wherein the irradiating step b) and the supplying step c) are repeated two or more times,
    wherein the forming step a) includes the step of etching the silicon oxide film in a predetermined pattern up to the surface of the substrate by using a plasma of a processing gas including an oxygen gas and a gas containing carbon and fluorine, thereby forming the composite product, and
    wherein the substrate processing method further comprises, after repeating the irradiating step b) and the supplying step c), the step of d) heating the substrate to shrink the organic material that still remains.

2. The method of claim 1, further comprising, after the heating step d), the step of e) supplying hydrogen fluoride steam onto the surface of the substrate to remove the inorganic material that still remains.

3. The method of claim 2, wherein the organic material which is shrinked during the heating step d) is separated from the substrate by the supplying step e).

4. A substrate processing method comprising the sequential steps of:
    a) forming a composite product on a surface of a substrate, a silicon oxide film being formed on the surface of the substrate and the composite product being formed of an inorganic material containing silicon oxide and an organic material containing carbon and fluorine;

b) irradiating ultraviolet rays on the surface of the substrate to remove a part of the organic material until a proportion of the inorganic material in the composite product is greater than that of the organic material in the composite product;
c) supplying hydrogen fluoride steam onto the surface of the substrate to remove a part of the inorganic material until a proportion of the organic material in the composite product is greater than that of the inorganic material in the composite product;
d) heating the substrate to shrink the organic material that still remains; and
e) supplying hydrogen fluoride steam onto the surface of the substrate to remove the inorganic material that still remains,
wherein, the forming step a) includes the step of etching the silicon oxide film in a predetermined pattern up to the surface of the substrate by using a plasma of a processing gas including an oxygen gas and a gas containing carbon and fluorine, thereby forming the composite product.

5. The method of claim 4, wherein the organic material which is shrinked during the heating step d) is separated from the substrate by the supplying step e).

* * * * *